(12) United States Patent
Zhu

(10) Patent No.: US 8,507,384 B2
(45) Date of Patent: Aug. 13, 2013

(54) METHOD FOR SELECTIVELY MODIFYING SPACING BETWEEN PITCH MULTIPLIED STRUCTURES

(75) Inventor: Hongbin Zhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 8 days.

(21) Appl. No.: 13/238,192

(22) Filed: Sep. 21, 2011

(65) Prior Publication Data

US 2012/0009793 A1     Jan. 12, 2012

Related U.S. Application Data

(63) Continuation of application No. 12/053,513, filed on Mar. 21, 2008, now Pat. No. 8,030,218.

(51) Int. Cl.
*H01L 21/311* (2006.01)

(52) U.S. Cl.
USPC ............................ 438/696; 438/694; 438/700

(58) Field of Classification Search
None
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,570,325 A | 2/1986 | Higuchi | |
| 4,648,937 A | 3/1987 | Ogura et al. | |
| 4,716,131 A | 12/1987 | Okazawa et al. | |
| 4,776,922 A | 10/1988 | Bhattacharyya et al. | |
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |

(Continued)

FOREIGN PATENT DOCUMENTS

| DE | 280851 | 7/1990 |
|---|---|---|
| DE | 42 36 609 A1 | 5/1994 |

(Continued)

OTHER PUBLICATIONS

Bergeron, et al., "Resolution Enhancement Techniques for the 90nm Technology Node and Beyond," Future Fab International, Issue 15, Jul. 11, 2003, 4 pages.

(Continued)

*Primary Examiner* — Shamim Ahmed
*Assistant Examiner* — Bradford Gates
(74) *Attorney, Agent, or Firm* — Knobbe, Martens, Olson & Bear LLP

(57) ABSTRACT

Methods for circuit material processing are provided. In at least one such method, a substrate is provided with a plurality of overlying spacers. The spacers have substantially straight inner sidewalls and curved outer sidewalls. An augmentation material is formed on the plurality of spacers such that the inner or the outer sidewalls of the spacers are selectively expanded. The augmentation material can bridge the upper portions of pairs of neighboring inner sidewalls to limit deposition between the inner sidewalls. The augmentation material is selectively etched to form a pattern of augmented spacers having a desired augmentation of the inner or outer sidewalls. The pattern of augmented spacers can then be transferred to the substrate through a series of selective etches such that features formed in the substrate achieve a desired pitch.

19 Claims, 37 Drawing Sheets

(56) References Cited

U.S. PATENT DOCUMENTS

| | | |
|---|---|---|
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,020,255 A | 2/2000 | Tsai et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee et al. |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,475,867 B1 | 11/2002 | Hui et al. |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,620,715 B1 | 9/2003 | Blosse et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,762,449 B2 | 7/2004 | Uchiyama et al. |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,818,141 B1 | 11/2004 | Plat et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 | 3/2006 | Fisher et al. |
| 7,074,668 B1 | 7/2006 | Park et al. |
| 7,115,525 B2 | 10/2006 | Abatchev et al. |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,253,118 B2 | 8/2007 | Tran et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,315,055 B2 | 1/2008 | Cho et al. |
| 7,442,976 B2 | 10/2008 | Juengling |
| 7,537,866 B2 | 5/2009 | Liu |
| 7,851,135 B2 | 12/2010 | Jung |
| 8,030,218 B2 * | 10/2011 | Zhu .............................. 438/736 |
| 2001/0005631 A1 | 6/2001 | Kim et al. |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura et al. |
| 2003/0006410 A1 | 1/2003 | Doyle |
| 2003/0044722 A1 | 3/2003 | Hsu et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0199949 A1 | 9/2005 | Chau et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046407 A1 * | 3/2006 | Juengling .................... 438/301 |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0018345 A1 | 1/2007 | Chao |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |

| | | | |
|---|---|---|---|
| 2007/0210449 | A1 | 9/2007 | Caspary et al. |
| 2007/0215874 | A1 | 9/2007 | Furukawa et al. |
| 2007/0215960 | A1 | 9/2007 | Zhu et al. |
| 2007/0275309 | A1 | 11/2007 | Liu |
| 2008/0054350 | A1 | 3/2008 | Breitwisch et al. |
| 2008/0292991 | A1 | 11/2008 | Wallow |

FOREIGN PATENT DOCUMENTS

| | | |
|---|---|---|
| EP | 0 227 303 | 7/1987 |
| EP | 0 491 408 | 6/1992 |
| EP | 1 357 433 | 10/2003 |
| JP | 57-048237 | 3/1982 |
| JP | 64-035916 | 2/1989 |
| JP | 05-343370 | 12/1993 |
| JP | H8-55908 | 2/1996 |
| JP | H8-55920 | 2/1996 |
| JP | 2000-208434 | 7/2000 |
| JP | 2000-357736 | 12/2000 |
| JP | 2004-080033 | 3/2004 |
| JP | 2004-152784 | 5/2004 |
| JP | 2005-150333 | 6/2005 |
| JP | 2006-351861 | 1/2012 |
| KR | 1999-0001440 | 1/1999 |
| KR | 1999-0027887 | 4/1999 |
| KR | 10-0546409 | 1/2006 |
| WO | WO 94/15261 | 7/1994 |
| WO | WO 02/099864 A1 | 12/2002 |
| WO | WO 04/001799 A2 | 12/2003 |
| WO | WO 2004/003977 A2 | 1/2004 |
| WO | WO 2005/010973 | 2/2005 |
| WO | WO 2005/034215 A1 | 4/2005 |
| WO | WO 2006/026699 | 3/2006 |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Bruek, "Optical and Interferometric Lithography—Nanotechnology Enablers," 2005, Proceedings of the IEEE, vol. 93, No. 10, pp. 1704-1721.

Choi et al., "Sublithographic nanofabrication technology for nanocatalysts and DNA chips," *J.Vac. Sci. Technol.*, pp. 2951-2955 (Nov./Dec. 2003).

Chung et al., "Pattern multiplication method and the uniformity of nanoscale multiple lines," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

"U.S. Appl. No. 11/543,515, filed Oct. 24, 2006."

*Ex Parte Cantell*, unpublished decision of the Board of Patent Appeals and Interferences, Mar. 4, 2005.

International Search Report dated Jul. 27, 2009 in International Application No. PCT/US2008/087029.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectric materials by high-density plasma etching," Solid State Tech., May 2000, 8 pages.

Office Action of Jun. 2, 2008 in U.S. Appl. No. 11/219,067, filed Sep. 1, 2005.

Office Action of Jun. 5, 2008 in U.S. Appl. No. 11/514,117, filed Aug. 30, 2006.

Office Action of Jul. 11, 2008 in U.S. Appl. No. 11/367,020, filed Mar. 2, 2006.

Sheats et al., "Microlithography: Science and Technology," 1998, Marcel Dekkar, Inc., pp. 104-105.

* cited by examiner

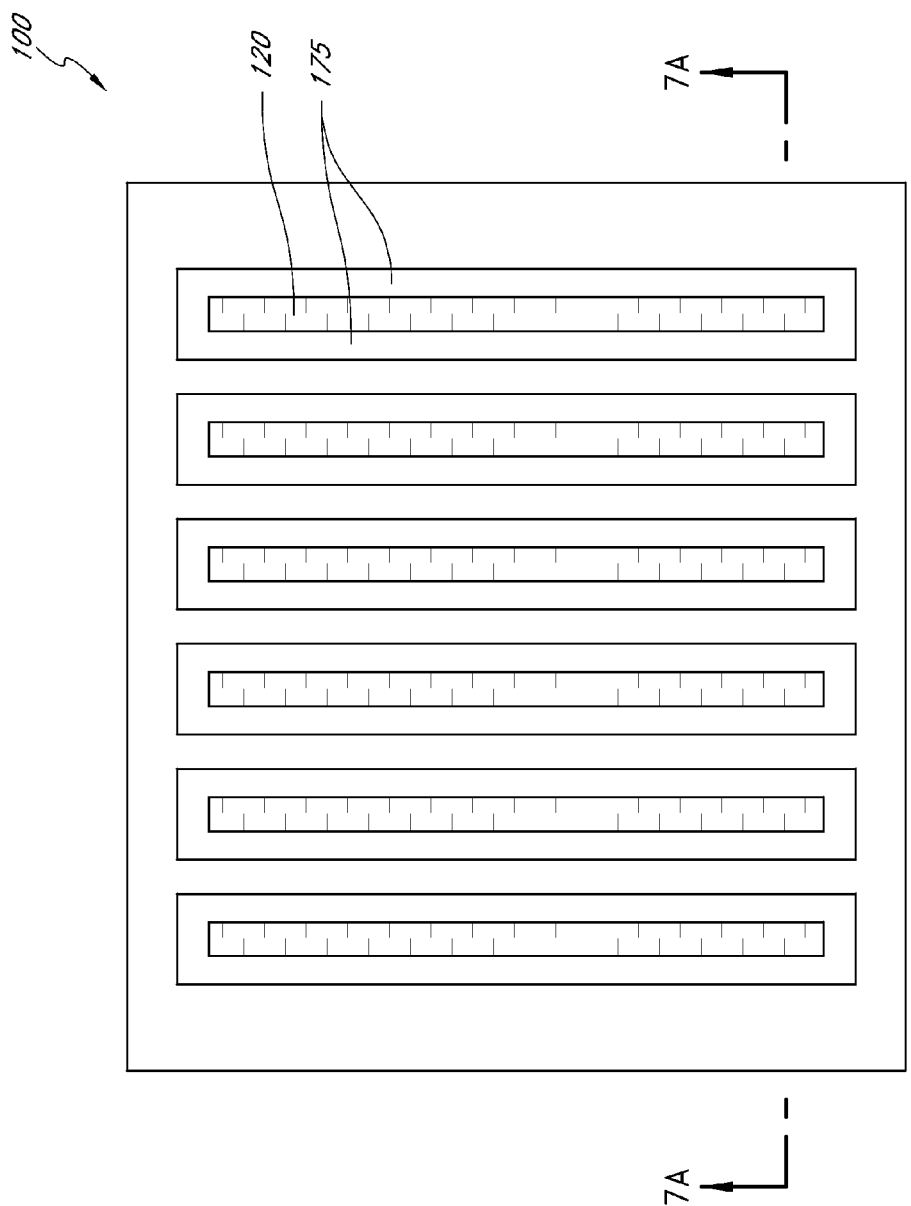

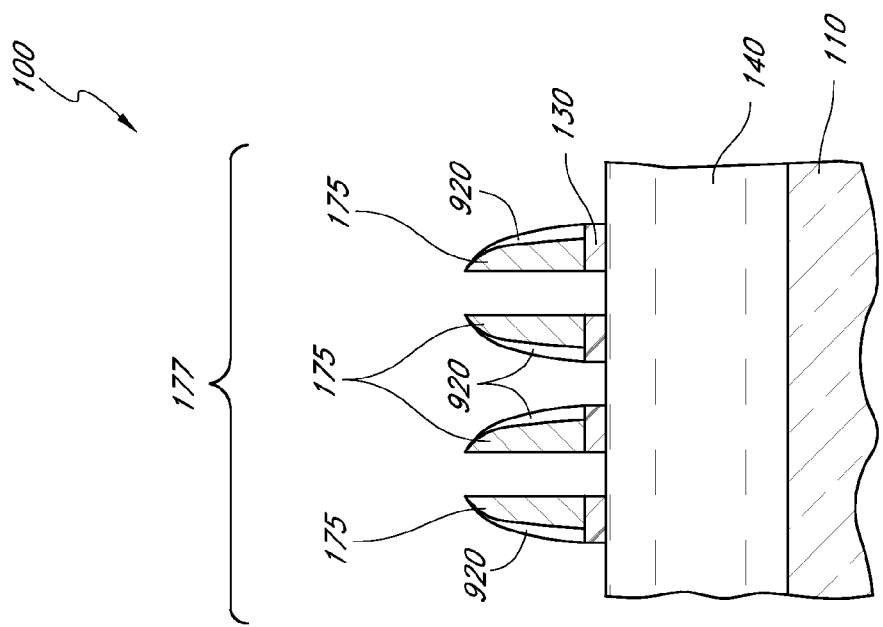

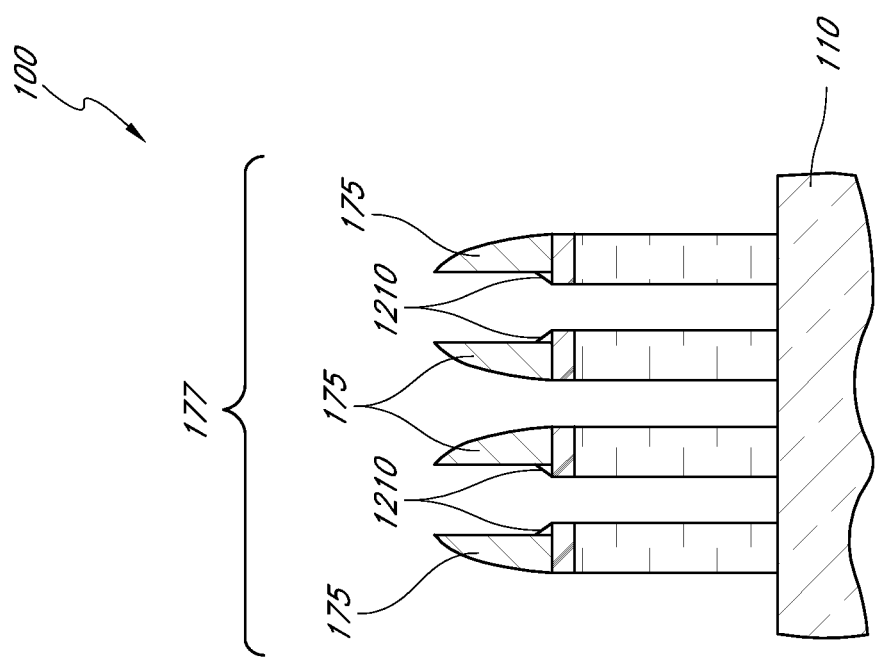

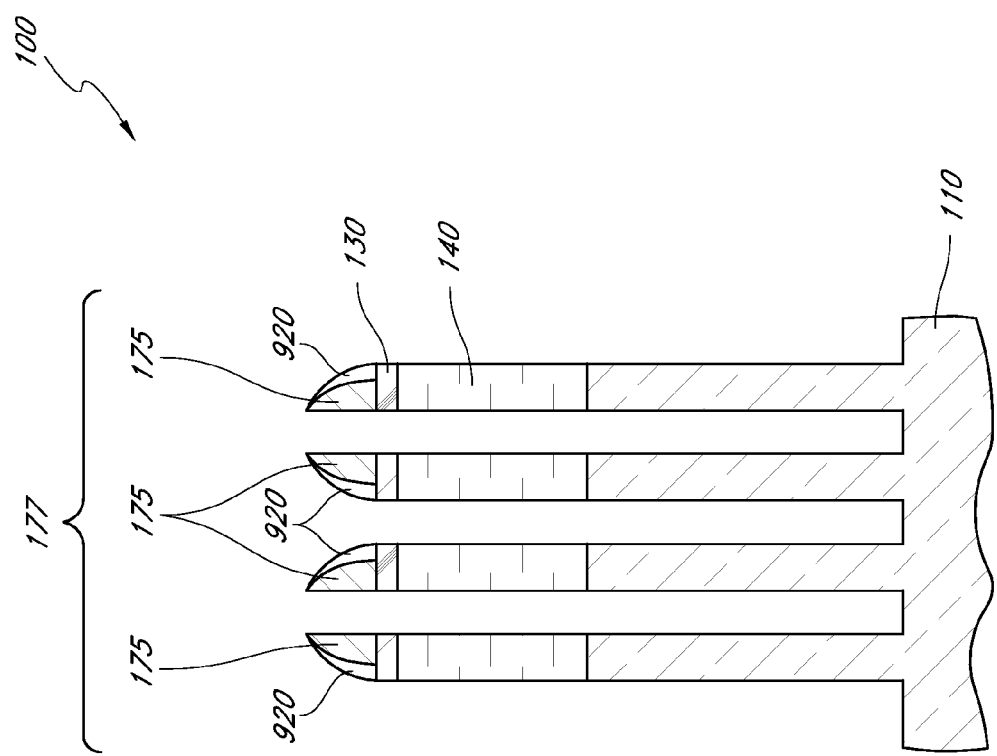

METHOD FOR SELECTIVELY MODIFYING SPACING BETWEEN PITCH MULTIPLIED STRUCTURES

PRIORITY CLAIM

This application is a continuation of U.S. patent application Ser. No. 12/053,513, filed Mar. 21, 2008, entitled METHOD FOR SELECTIVELY MODIFYING SPACING BETWEEN PITCH MULTIPLIED STRUCTURES.

REFERENCE TO RELATED APPLICATIONS

This application is related to the following: U.S. patent application Ser. No. 10/934,778 to Abatchev et al., filed Sep. 2, 2004; U.S. patent application Ser. No. 11/214,544 to Tran et al., filed Aug. 29, 2005; and U.S. patent application Ser. No. 11/959,409 to Tran et al., filed Dec. 18, 2007.

BACKGROUND OF THE INVENTION

1. Field of the Invention

This invention relates generally to the fabrication of integrated circuits and electronic devices and, more particularly, to fabrication methods and related structures.

2. Description of the Related Art

As a consequence of many factors, including demand for increased portability, computing power, memory capacity and energy efficiency, integrated circuits are constantly being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically includes millions or billions of identical circuit elements, known as memory cells. A memory cell typically consists of two electrical devices: a storage capacitor and an access field effect transistor. Each memory cell is an addressable location that may store one bit (binary digit) of data. A bit may be written to a cell through the transistor and may be read by sensing charge in the capacitor.

In another example, flash memory typically includes billions of flash memory cells containing floating gate field effect transistors that can retain a charge. The presence or absence of a charge in the floating gate determines the logic state of the memory cell. A bit may be written to a cell by injecting charge to or removing charge from a cell. Flash memory cells may be connected in different architecture configurations, each with different schemes for reading bits. In a "NOR" architecture configuration, each memory cell is coupled to a bit line and may be read individually. In a "NAND" architecture configuration, memory cells are aligned in a "string" of cells, and an entire bit line is activated to access data in one of the string of cells.

In general, by decreasing the sizes of the electrical devices that constitute a memory cell and the sizes of the conducting lines that access the memory cells, the memory devices may be made smaller. Additionally, storage capacities may be increased by fitting more memory cells on a given area in the memory devices.

The concept of pitch may be used to describe one aspect of the sizes of features in an integrated circuit such as a memory device. Pitch is defined as the distance between identical points in two neighboring features, such as features in an array, which are typically arranged in a repeating pattern. These features are typically defined by spaces between adjacent features, which spaces are typically filled by a material, such as an insulator. As a result, pitch may be viewed as the sum of the width of a feature and of the width of the space on one side of the feature separating that feature from a neighboring feature. It will be appreciated that the spaces and features, such as lines, typically repeat to form a repetitive pattern of spacers and features.

Critical dimension (CD) is another term used to describe the sizes of features. The critical dimension is the smallest dimension of a feature in a particular circuit or masking scheme. Controlling the CD of certain structures, such as shallow trench isolation (STI) structures, during integrated circuit fabrication helps to facilitate the continued size reduction of integrated circuits by, e.g., ensuring predictable circuit performance.

The continual reduction in feature sizes places ever greater demands on the techniques used to form the features. For example, photolithography is commonly used to pattern features, such as conductive lines, in integrated circuit fabrication. However, due to factors such as optics, light or radiation wavelength and available photoresist materials, photolithography techniques may each have a minimum pitch or critical dimension below which a particular photolithographic technique cannot reliably form features. Thus, the inherent limitations of photolithographic techniques are obstacles to continued feature size reduction.

"Pitch doubling," which is also referred to as "pitch multiplication," is one proposed method for extending the capabilities of photolithographic techniques beyond their minimum pitch. A pitch multiplication method is illustrated in FIGS. 1A-1F and described in U.S. Pat. No. 5,328,810, issued to Lowrey et al. With reference to FIG. 1A, a pattern of lines 10 is photolithographically formed in a photoresist layer, which overlies a layer 20 of an expendable material, which in turn overlies a substrate 30. As shown in FIG. 1B, the pattern in the photoresist layer is transferred to the layer 20, thereby forming placeholders, which are also referred to herein as mandrels, 40. The photoresist lines 10 are stripped and the mandrels 40 are etched to increase the distance between neighboring mandrels 40, as shown in FIG. 1C. A layer 50 of spacer material is subsequently deposited over the mandrels 40, as shown in FIG. 1D. Spacers 60 are then formed on the sides of the mandrels 40. The spacer formation can be accomplished by preferentially etching the spacer material from the horizontal surfaces 70 and 80, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by the spacers 60.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

While allowing for smaller critical dimensions and pitch, pitch multiplication faces continuing development as new challenges emerge, as the requirements of integrated circuit fabrication change. Accordingly, there is a constant need for methods and structures for forming small features.

BRIEF DESCRIPTION OF THE DRAWINGS

FIGS. 7A and 7B are schematic, cross-sectional side and top plan views of the partially formed integrated circuit of FIG. 6 after a spacer etch, in accordance with some embodiments of the invention.

FIGS. 15A and 15B are schematic, cross-sectional side views of the partially formed integrated circuit of FIGS. 14A and 14B after forming a combined pattern defined by a patterned planarization material and the augmented spacers to an underlying hard mask layer, in accordance with some embodiments of the invention.

FIGS. 16A and 16B are schematic, cross-sectional side views of the partially formed integrated circuit of FIGS. 15A and 15B after transferring the combined pattern to a primary mask layer, in accordance with some embodiments of the invention.

FIGS. 17A and 17B are schematic, cross-sectional side views of the partially formed integrated circuit of FIGS. 16A and 16B after transferring the combined pattern to the underlying substrate, in accordance with some embodiments of the invention.

DETAILED DESCRIPTION OF SOME EMBODIMENTS

Figure 1A:
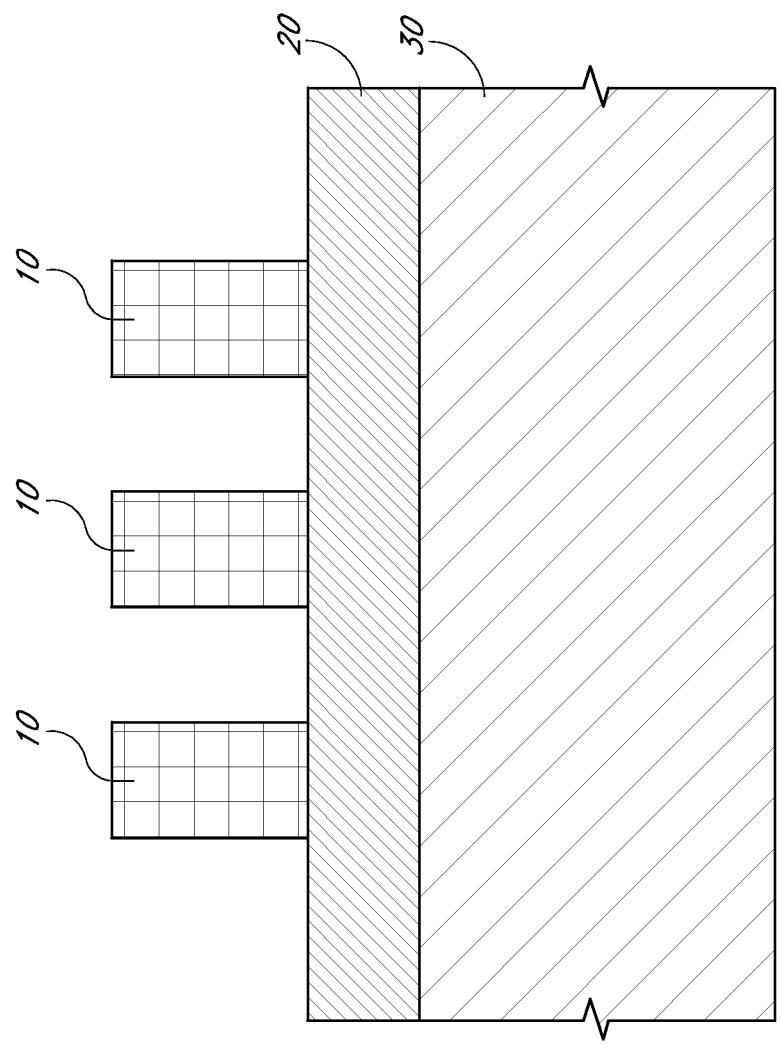
FIGS. 1A-1F are schematic, cross-sectional side views of a sequence of masking patterns for forming conductive lines, in accordance with a prior art pitch multiplication method.
Figure 1B:
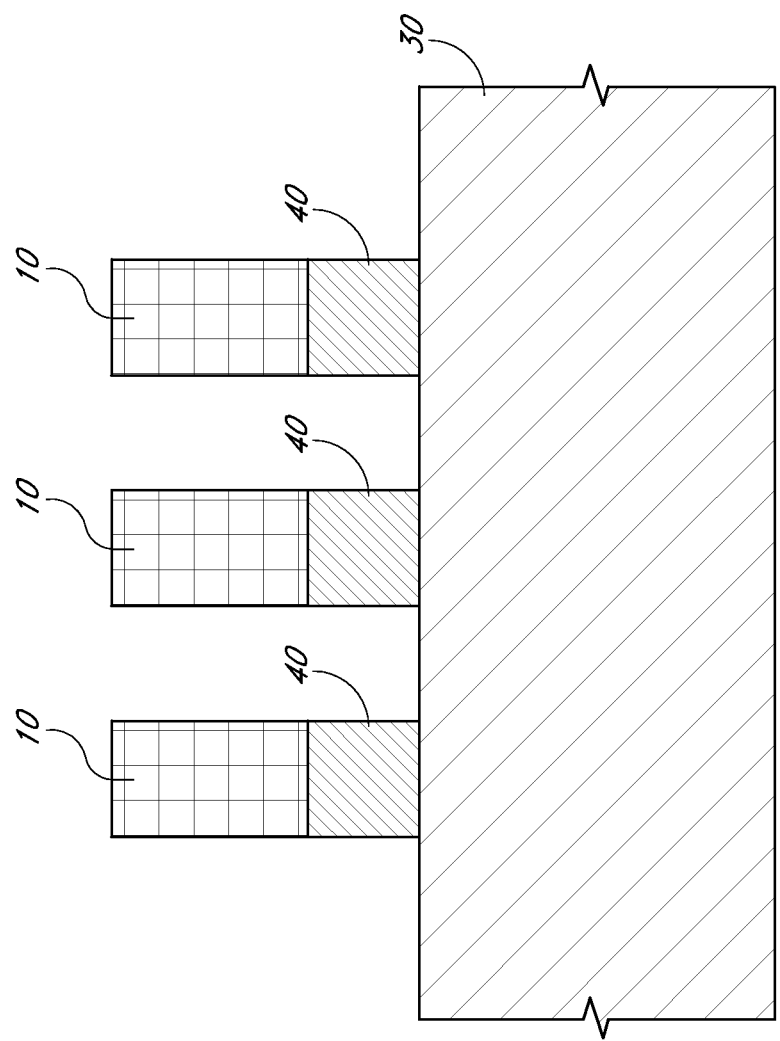
Figure 1C:
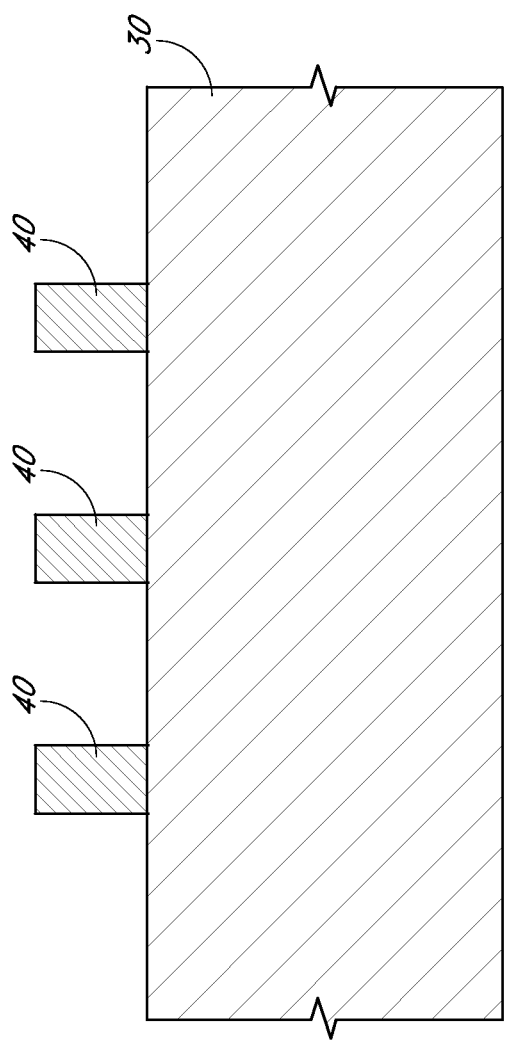
Figure 1D:
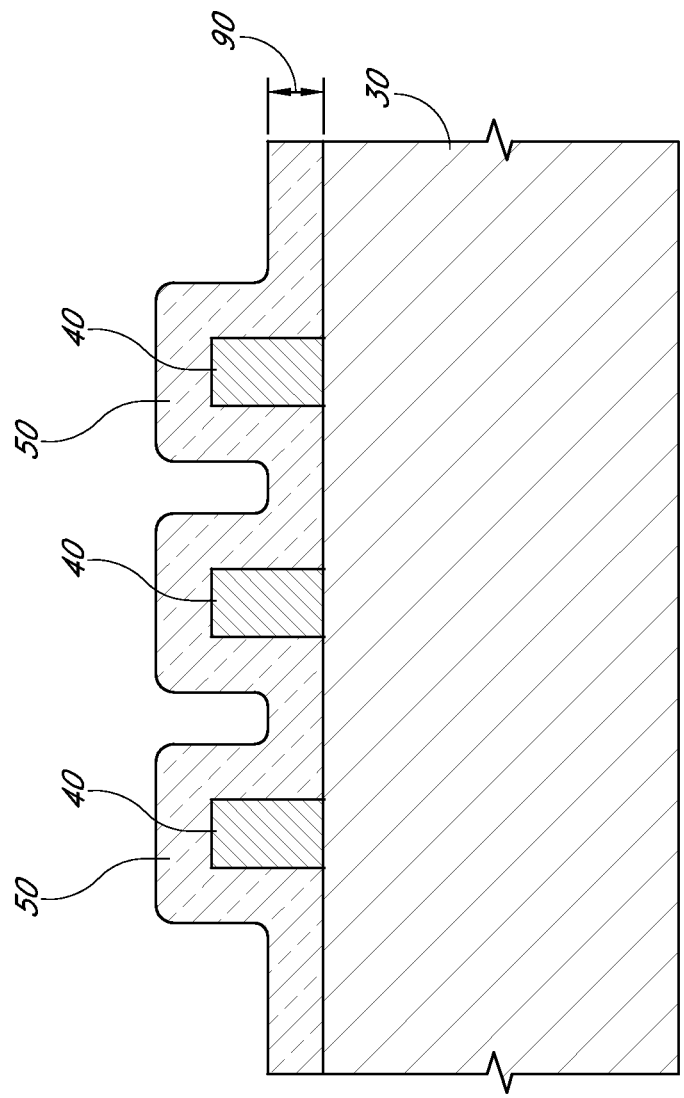
Figure 1E:
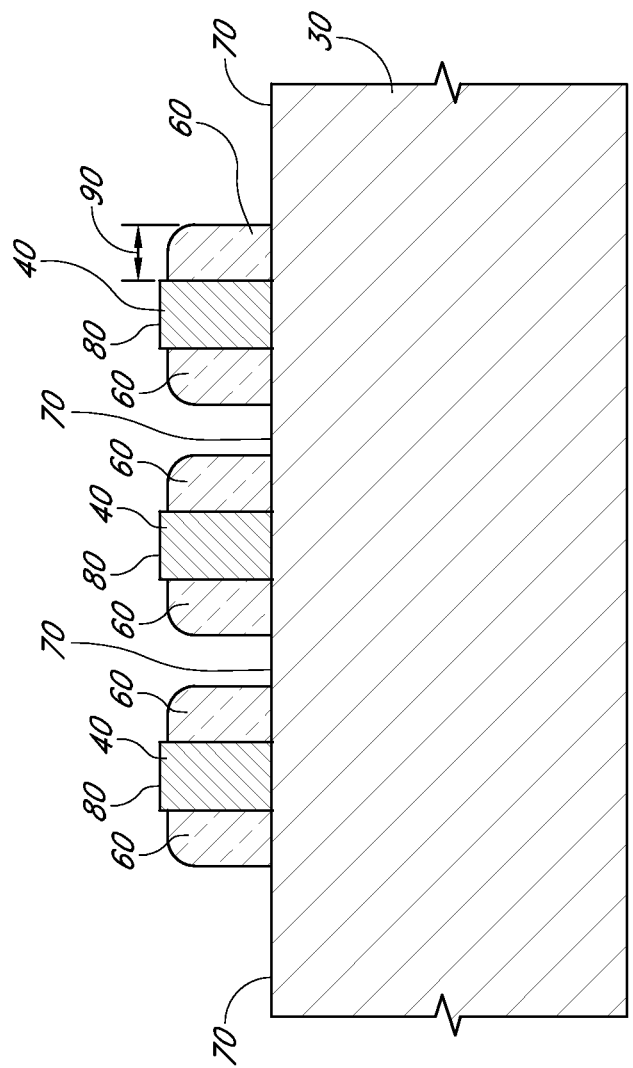
Figure 1F:
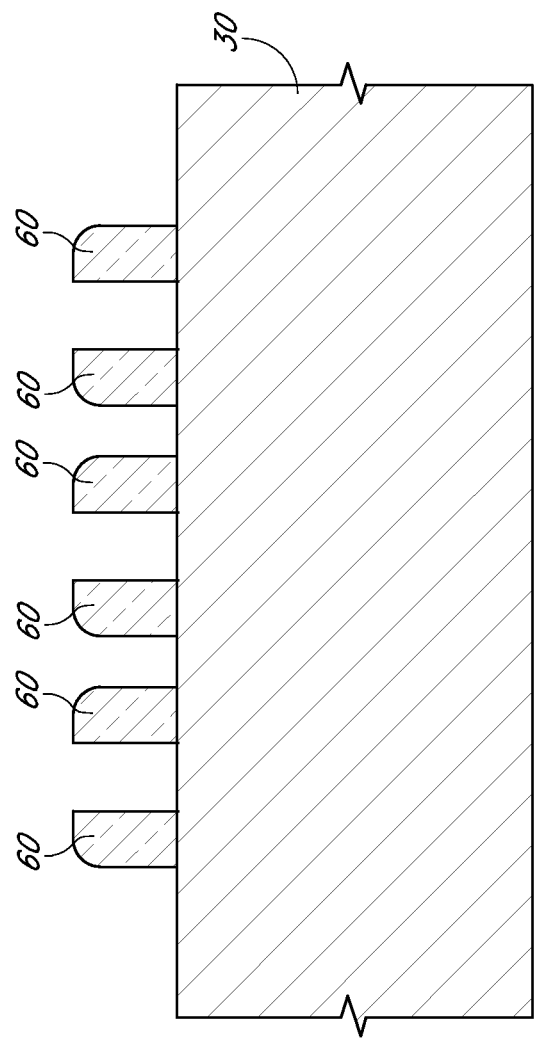

A challenge in current pitch multiplication structures is achieving a desired balance between the inner and outer spaces. The inner and outer spaces are typically formed through a process of forming spaced apart mandrels, depositing a spacer material layer on the mandrels, directionally etching the spacer material layer, and removing the mandrels. This process results in spacers with substantially straight inner space walls, which were alongside the mandrels, and curved outer space walls on the side of the spacers without mandrels. As used herein, inner and outer space walls, which can also be referred to as sidewalls, can refer to opposite sides of the same spacer. Facing adjacent straight inner walls define the inner space and facing adjacent curved outer walls define the outer space. The spacers are used as a mask to etch underlying materials, such as hard masks and substrates. As a result, the spacing between spacers determines the spacing between later-formed features in the hard masks and substrates. Variations in process conditions and chemistries can cause the inner and outer spaces to be unbalanced, such that one is larger than the other. It will be appreciated that improving the uniformity between the inner and outer space is beneficial for improving the alignment of features formed using the spacers and for improving the reliability of the final product formed by the process. It has been believed that once the spacing between the free-standing spacers has been formed by the spacer formation process, the spacing cannot be selectively altered since the sides of the spacers are equally exposed to process gases.

Advantageously, some embodiments of the invention allow the inner or outer spaces to be selectively changed by laterally expanding the inner or outer sidewalls of spacers. Certain embodiments of the invention employ material deposition and/or etches that are selective with regard to the inner and outer spaces or walls.

In pitch multiplication, spacers typically have a straight inner wall and a curved outer wall due to formation of the spacers by etching a layer of spacer material. The curved outer wall is formed by greater exposure of the outer wall to etchant than the inner wall, which is typically adjacent to a mandrel that protects the inner wall from the etchant to a degree. Deposition and etching of an augmentation material on the spacers can be used to selectively grow or reduce the inner or outer space. Deposited material at the tops of the neighboring spacers tend to bridge together, e.g., seal, during the deposition such that the deposition in the inner space is blocked or slowed down but the deposition in the outer space is not similarly blocked or slowed down. As a result, the thickness of the deposited material is different between the inner to the outer spaces after the deposition and facilitates selective modifications of the widths of the inner and outer spaces. In some embodiments, the deposited material is a polymer, such as an organic polymer.

In certain embodiments where reduction of the outer space is desired, after deposition of the augmentation material, an etch at a high bias power is used. The etch is preferably an anisotropic etch at a bias power that is sufficiently high to remove the top bridge of material and the deposited augmentation material in the inner space. Since the inner space is not as heavily deposited as the outer space due to formation of the bridge between neighboring pairs of spacers limiting additional deposition, the inner space is etched more quickly during the etch. Therefore, the etch maintains the inner space substantially as it was before the deposition of augmentation material and helps to reduce the outer space since some deposited augmentation material still remains on the outer wall of the spacer, due to the higher levels of deposited material on the outer wall.

In certain embodiments where reduction of the inner space is desired, after deposition of the augmentation material, an etch at a relatively low bias power is used to etch the deposited augmentation material. The etch is preferably an anisotropic etch performed at a sufficiently low power to leave deposited material, which can also be referred to as footers, at corners in the inner space, the corners defined by the inner sidewall and an underlying material. While the invention is not limited by theory, because the inner sidewall is straight and the outer space is relatively widely open due to the curved outer sidewall, it is believed that this etching is more isotropic in the inner space but more anisotropic in the outer space. It is believe the relatively low bias power, in conjunction with the relatively narrow inner space, reduces the directionality of etchant species in the inner space while the relatively widely open outer space facilitates the directional movement of etchant species. The result of this differential etch behavior is that the outer sidewalls defining the outer space is relatively straight while the bottom of the inner space is rounded and has footers of deposited augmentation material on each sidewall. After the etch of the augmentation material, a pattern transfer etch of material underlying the spacers is applied. This pattern transfer etch has a high selectivity for the underlying material relative to the augmentation material. The rounded inner space bottom reduces the available opening for etching the underlying material, thereby narrowing the inner space for the pattern transfer. As a result, the pattern transferred to the underlying material has features corresponding to an inner space which is narrower than that formed initially after the spacer formation etch.

Reference will now be made to the Figures, wherein like numerals refer to like parts throughout. It will be appreciated that these Figures are not necessarily drawn to scale. Moreover, it will be appreciated that only a limited number of features, including mask features and etched features such as bit lines, word lines, spacers, and memory blocks are illustrated for ease of discussion and illustration. Different numbers of and/or positions for these features can be provided in some embodiments.

In a first phase of some embodiments of the invention, mask features are formed by pitch multiplication.

Figure 2:
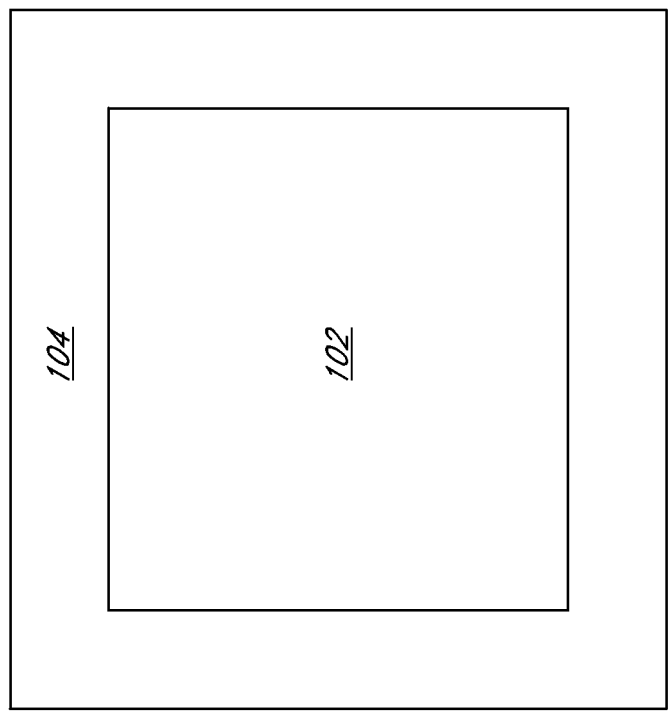
FIG. 2 is a schematic top plan view of a partially formed integrated circuit, in accordance with some embodiments of the invention.

FIG. 2 shows a top view of a portion of a partially fabricated integrated circuit 100. While the embodiments of the invention may be used to form any integrated circuit and may be applied to form masks for patterning various substrates, they may particularly advantageously be applied to form devices having arrays of electrical devices, including memory cell arrays for volatile and non-volatile memory devices such as DRAM, ROM or flash memory, including NAND or NOR flash memory, or integrated circuits having logic or gate arrays. For example, the logic array may be a field programmable gate array (FPGA) having a core array similar to a memory array and a periphery with supporting logics. Consequently, the integrated circuit 100 may be, e.g., a memory chip or a processor, which may include both a logic array and embedded memory, or any other integrated circuit having a logic or a gate array.

With continued reference to FIG. 2, a central region 102, which will be referred to hereinafter by example as the "array," is surrounded by a peripheral region 104, which is often referred to hereinafter as the "periphery." It will be appreciated that, in a fully formed integrated circuit, such as a memory device, the array 102 will typically be densely populated with electrically conductive line and electrical devices, including transistors and/or capacitors. In a memory device, the electrical devices form a plurality of memory cells, which may be arranged in a regular grid pattern at the intersection of access lines and data lines, which are conventionally referred to in the industry as "word" lines and "bit" lines, respectively. Desirably, pitch multiplication may be used to form features such as rows/columns of transistors and/or capacitors in the array 102, as discussed herein. On the other hand, the periphery 104 typically comprises features larger than those in the array 102. Conventional photolithography, rather than pitch multiplication, is typically used to pattern features, such as logic circuitry, in the periphery 104, because the geometric complexity of logic circuits located in the periphery 104 makes using pitch multiplication difficult, whereas the regular grid typical of array patterns is conducive to pitch multiplication. In addition, some devices in the periphery require larger geometries due to electrical constraints, thereby making pitch multiplication less advantageous than conventional photolithography for such devices. In some cases, the periphery 104 may contain patterns/circuits defined by both conventional lithography and pitch multiplication. In addition to possible differences in relative scale, it will be appreciated by the skilled artisan that the relative positions, and the number of periphery 104 and array 102 regions in the partially fabricated integrated circuit 100 may vary from that depicted.

Figure 3A:
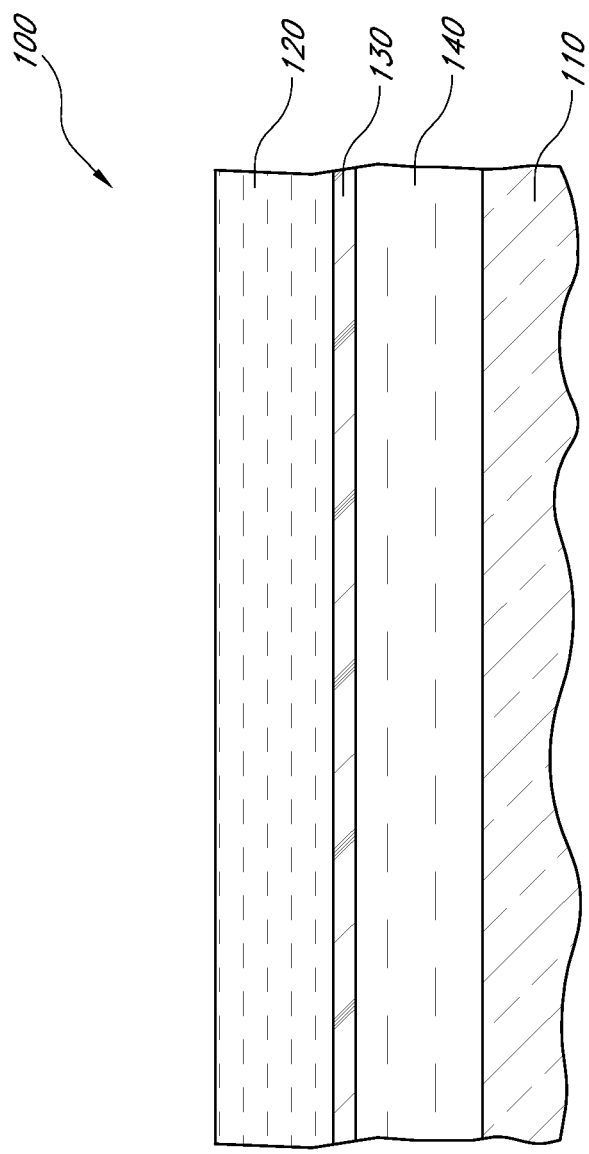
FIGS. 3A and 3B are schematic cross-sectional side and top views of the partially formed integrated circuit of FIG. 2, in accordance with some embodiments of the invention.
Figure 3B:
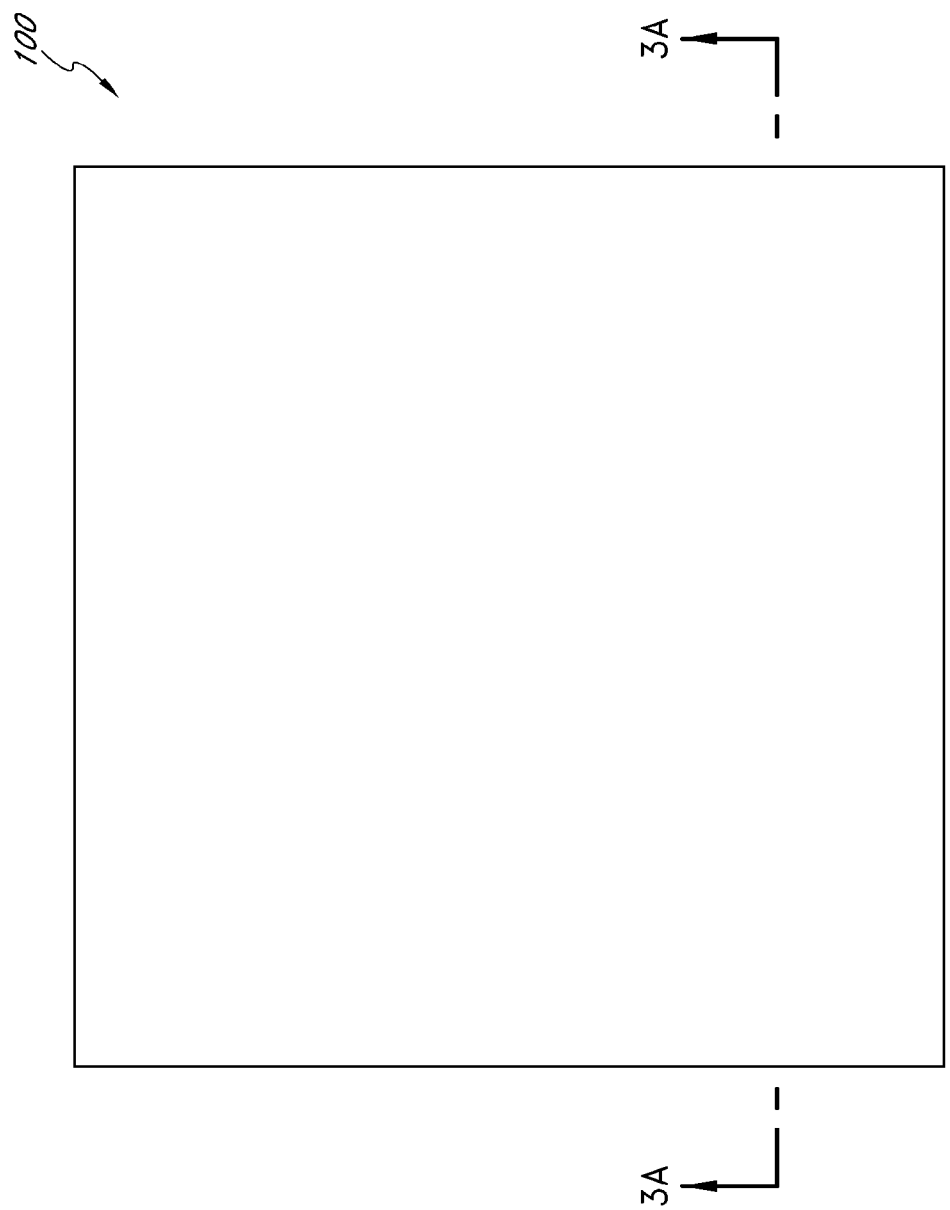

FIG. 3A shows a cross-sectional side view of the partially formed integrated circuit 100 and FIG. 3B shows a top plan view of the integrated circuit 100. With reference to FIG. 3A various masking layers 120-140 are provided above a substrate 110. The layers 120-140 will be etched to form a mask for patterning the substrate 110, as discussed below. In the illustrated embodiment, a selectively definable layer 120 overlies a hard mask layer 130, which can also be referred to as an etch stop, which overlies a primary mask layer 140, which overlies the substrate 110 to be processed (e.g., etched) through a mask.

The materials for the layers 120-140 overlying the substrate 110 are chosen based upon consideration of the chemistry and process conditions for the various pattern forming and pattern transferring steps discussed herein. Because the layers between the topmost selectively definable layer 120 and the substrate 110 function to transfer a pattern derived from the selectively definable layer 120 to the substrate 110, the layers 130-140 between the selectively definable layer 120 and the substrate 110 are chosen so that they may be selectively etched relative to other exposed materials. It will be appreciated that a material is considered selectively, or preferentially, etched when the etch rate for that material is at least about 2-3 times greater, at least about 10 times greater, at least about 20 times greater, or at least about 40 times greater than that for surrounding materials. Because a goal of the layers 120-130 overlying the primary hard mask layer 140 is to allow well-defined patterns to be formed in that layer 140, it will be appreciated that one or more of the layers 120-130 may be omitted or substituted if suitable other materials, chemistries and/or process conditions are used. For example, where the substrate is relatively simple and may be selectively etched relative to the hard mask layer 130, the primary mask layer 140 may be omitted and patterns may be transferred directly to the substrate using the hard mask layer 130.

With continued reference to FIG. 3A, the selectively definable layer 120 is photodefinable in some embodiments, e.g., formed of a photoresist, including any photoresist, including any positive or negative photoresist, known in the art. For example, the photoresist may be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. In addition, maskless lithography, or maskless photolithography, may be used to define the selectively definable layer 120. Examples of photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are used with photolithography systems utilizing relatively short wavelength light, e.g., 193 nm wavelength light. KrF photoresists are used with longer wavelength photolithography systems, such as 248 nm systems. In other embodiments, the layer 120 and any subsequent resist layers may be formed of a resist that may be patterned by nano-imprint lithography, e.g., by using a mold or mechanical force to pattern the resist.

Figure 7A:
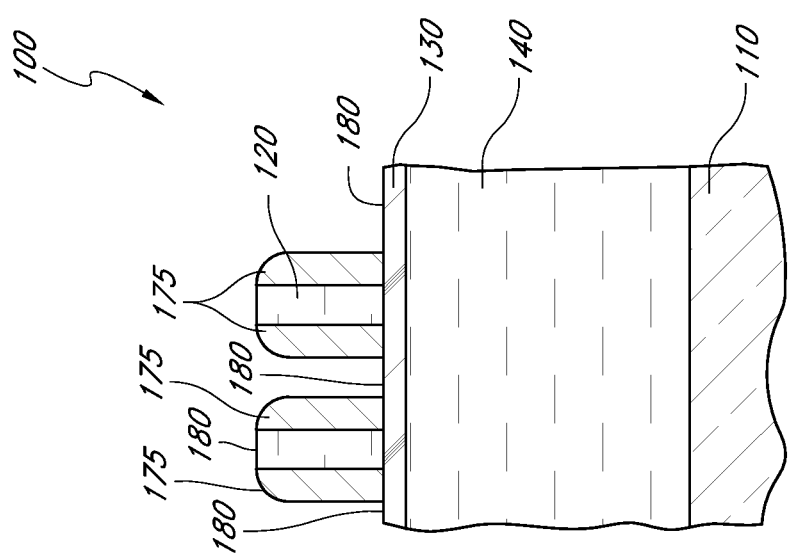

In some embodiments, the material for the hard mask layer 130 comprises an inorganic material. Materials for the hard mask layer 130 include silicon oxide ($SiO_2$), silicon or an anti-reflective coating (ARC), such as a silicon-rich silicon oxynitride, a silicon-rich nitride, or a film that has the desired etch selectivity relative to the spacers 175 or other exposed materials (FIG. 7A). In some embodiments, a Si, O, and N-containing spin-on hard mask with, for example, a 17% or a 43% Si content may be used for the layer 130, which may be part of a multi-layer resist (MLR). The hard mask layer 130 may also include combinations of layers of materials, e.g., a bottom anti-reflective coating (BARC) over a dielectric anti-reflective coating (DARC). For ease of description, in the illustrated embodiment, the hard mask layer 130 is an anti-reflective coating, such as DARC. It will be appreciated that using ARCs for the hard mask layer 130 may be particularly advantageous for forming patterns having pitches near the resolution limits of a photolithographic technique. The ARCs can enhance resolution by minimizing light reflections, thus increasing the precision with which photolithography can define the edges of a pattern.

With continued reference to FIG. 3A, embodiments of the invention may utilize the primary masking layer 140 to facilitate pattern transfer to a substrate. As noted above, in common methods of transferring patterns, both the mask and the underlying substrate are exposed to etchant, which may wear away a mask before the pattern transfer is complete. These difficulties are exacerbated where the substrate comprises multiple different materials to be etched. In some embodiments, the layer 140 is formed of a carbon-containing underlayer material.

In some other embodiments, due to its excellent etch selectivity relative to a variety of materials, including oxides, nitrides and silicon, the primary masking layer may be formed of amorphous carbon. The amorphous carbon layer may be formed by chemical vapor deposition using a hydrocarbon compound, or mixtures of such compounds, as carbon precursors. Carbon precursors may include propylene, propyne, propane, butane, butylene, butadiene and acetelyne. A method for forming amorphous carbon layers is described in U.S. Pat. No. 6,573,030 B1, issued to Fairbairn et al. on Jun. 3, 2003. In some embodiments, the amorphous carbon is a form of amorphous carbon that is highly transparent to light and that offers further improvements for photo alignment by being transparent to the wavelengths of light used for such alignment. Deposition techniques for forming such transparent carbon can be found in, e.g., A. Helmbold, D. Meissner, Thin Solid Films, 283 (1996) 196-203. In addition, the amorphous carbon may be doped as known in the art.

It will be appreciated that the "substrate" to which patterns are transferred may include a layer of a single material, a plurality of layers of different materials, a layer or layers having regions of different materials or structures in them, etc. These materials may include semiconductors, insulators, conductors, or combinations thereof.

Figure 4A:
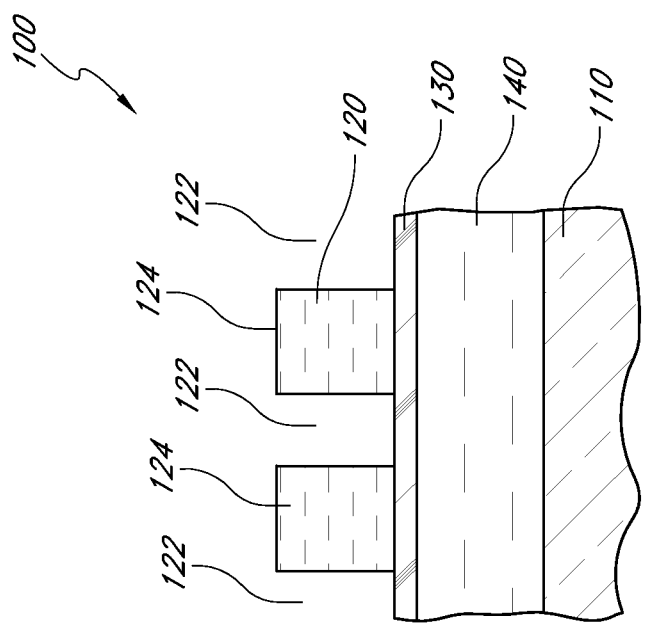
FIGS. 4A and 4B are schematic cross-sectional side and top plan views of the partially formed integrated circuit of FIGS. 3A and 3B after forming lines in a photoresist layer in an array region of the integrated circuit, in accordance with some embodiments of the invention.
Figure 4B:
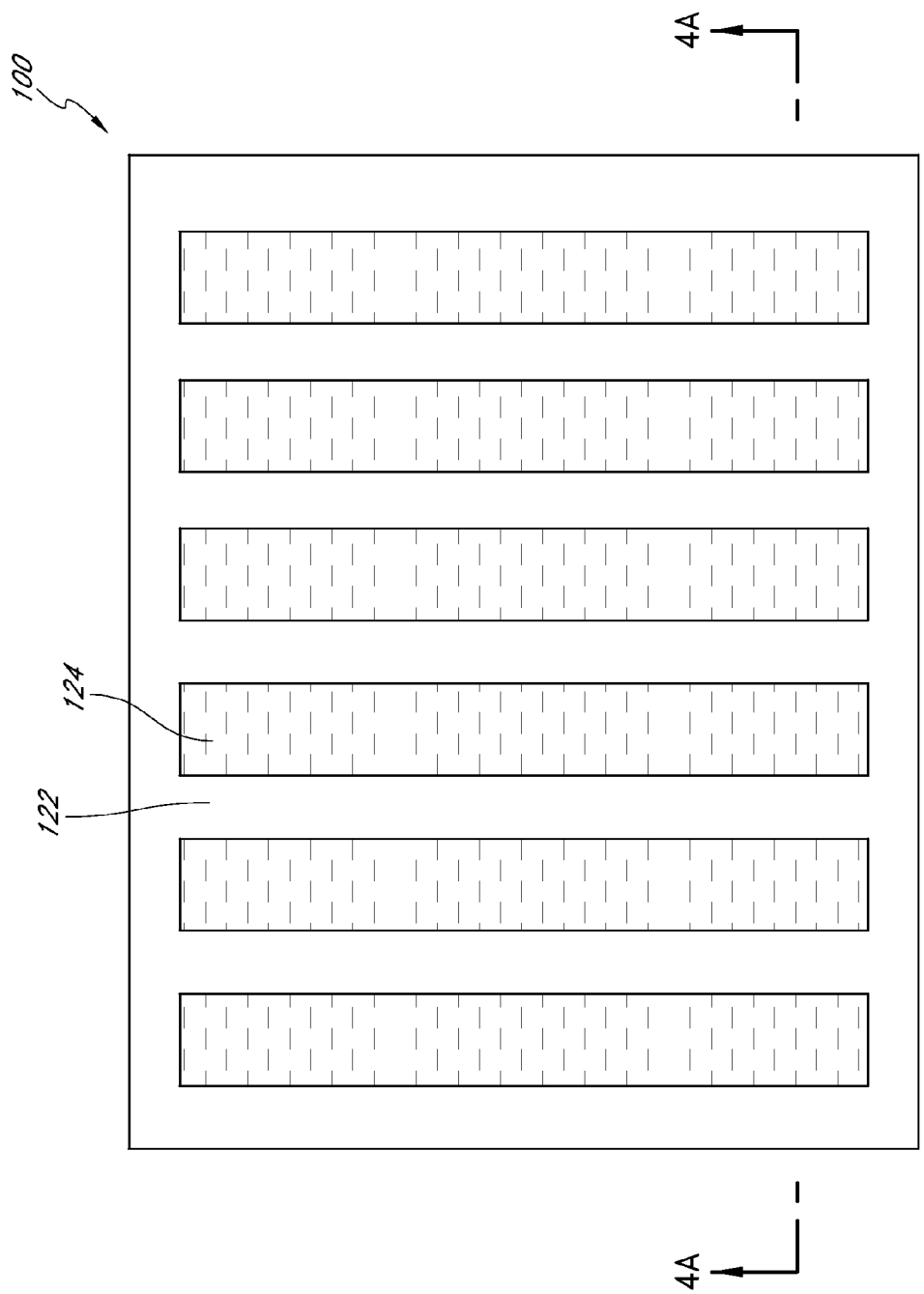

With reference to FIGS. 4A and 4B, a pattern comprising spaces, such as trenches 122, which are delimited by photodefinable material features 124, is formed in the photodefinable layer 120. The trenches 122 may be formed by, e.g., photolithography with 248 nm or 193 nm light, in which the layer 120 is exposed to radiation through a reticle and then developed. After being developed, the remaining photodefinable material, photoresist in the illustrated embodiment, forms mask features such as the illustrated lines 124 (shown in cross-section only).

The pitch of the resulting lines 124 is equal to the sum of the width of a line 124 and the width of a neighboring space 122. To minimize the critical dimensions of features formed using this pattern of lines 124 and spaces 122, the pitch may be at or near the limits of the photolithographic technique used to pattern the photodefinable layer 120. For example, for photolithography utilizing 248 nm light, the pitch of the lines 124 may be about 100 nm. Thus, the pitch may be at the minimum pitch of the photolithographic technique and the spacer pattern discussed below may advantageously have a pitch below the minimum pitch of the photolithographic technique. Alternatively, because the margin of error for position and feature size typically increases as the limits of a photolithographic technique are approached, the lines 124 may be formed having larger feature sizes, e.g., 200 nm or more, to minimize errors in the position and sizes of the lines 124.

Figure 5A:
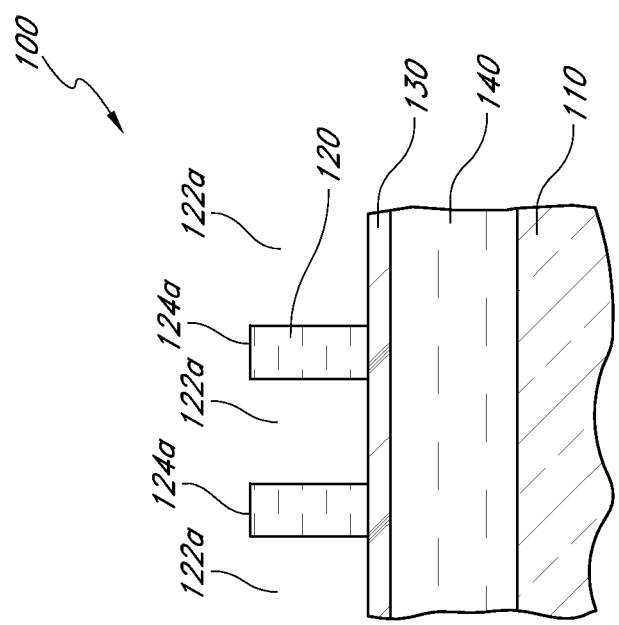
FIGS. 5A and 5B are schematic cross-sectional side and top plan views of the partially formed integrated circuit of FIGS. 4A and 4B after widening spaces between lines in the photoresist layer, in accordance with some embodiments of the invention.
Figure 5B:
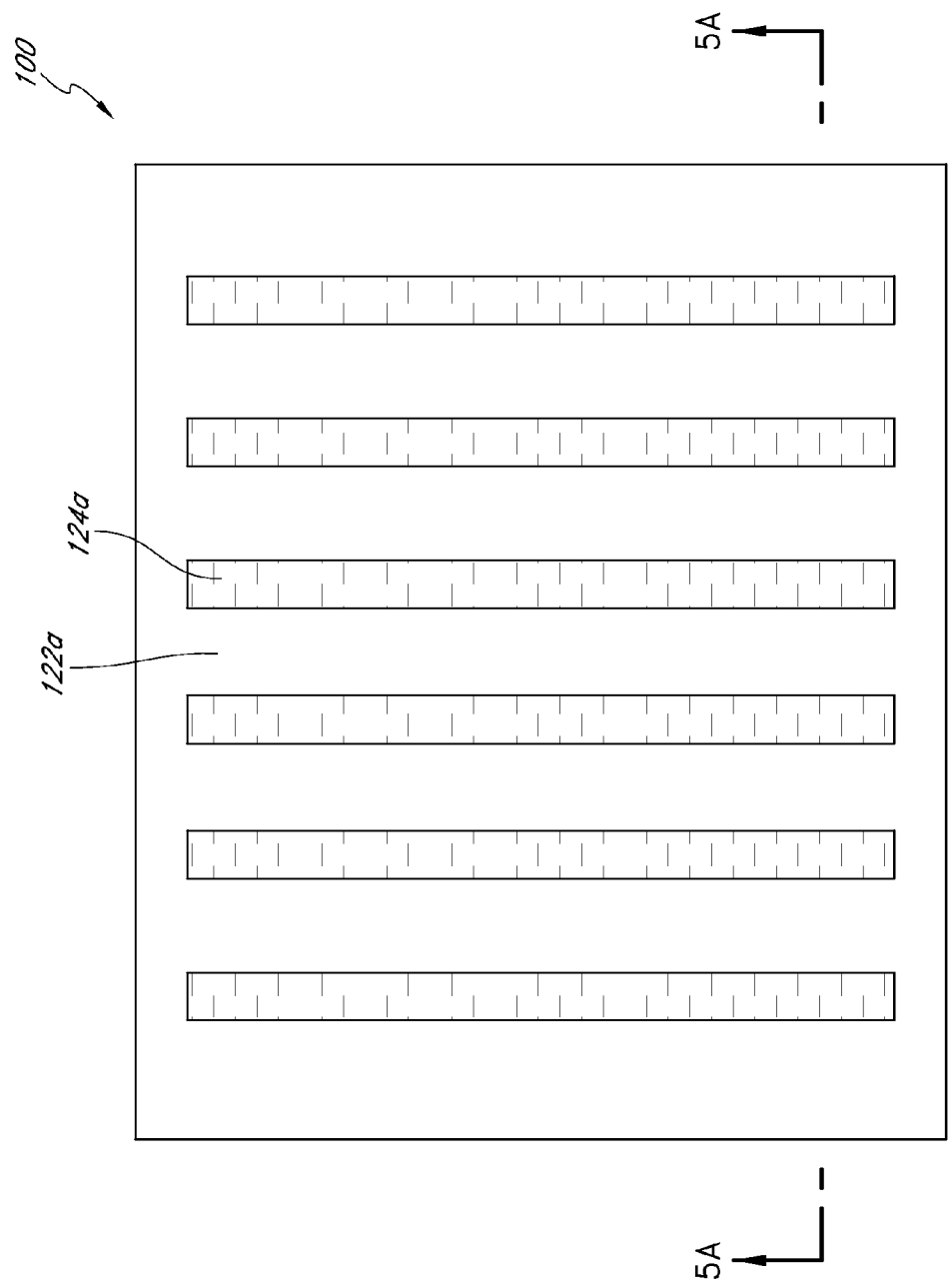

As shown in FIGS. 5A and 5B, the spaces 122 are widened by etching the photoresist lines 124, to form modified spaces 122a and lines 124a. The photoresist lines 124 are etched using an isotropic etch to "shrink" or trim those features. Suitable etches include etches using an oxygen-containing plasma, e.g., a $SO_2/O_2/N_2/Ar$ plasma, a $Cl_2/O_2/He$ plasma or a $HBr/O_2/N_2$ plasma. The extent of the etch is selected so that the widths of the lines 124a are substantially equal to the desired spacing between the later-formed spacers 175 (FIG. 7), as will be appreciated from the discussion below. For example, the width of the lines 124 may be reduced from about 80-120 nm to about 30-70 nm or about 50-70 nm. Advantageously, the width-reducing etch allows the lines 124a to be narrower than would otherwise be possible using the photolithographic technique used to pattern the photodefinable layer 120. While the critical dimensions of the lines 124a may be etched below the resolution limits of the photolithographic technique, it will be appreciated that this etch does not alter the pitch of the spaces 122a and lines 124a, since the distance between identical points in these features remains the same.

Figure 6:
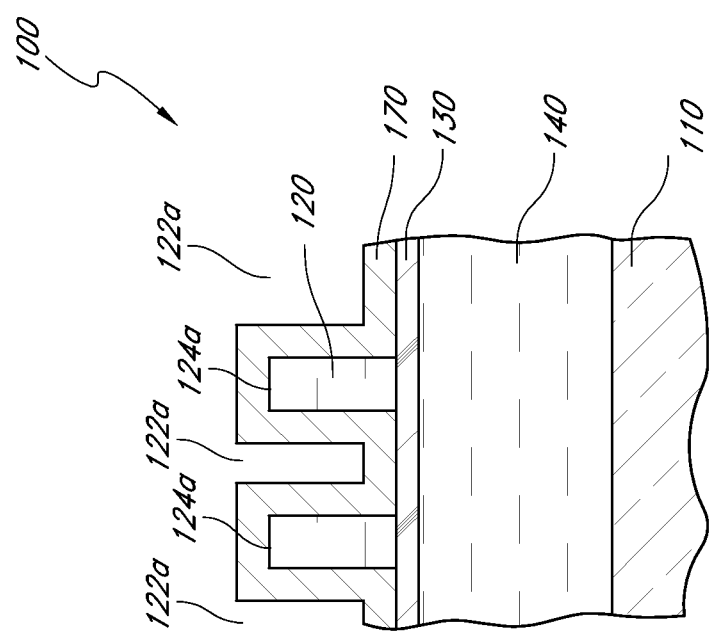
FIG. 6 is a schematic, cross-sectional side view of the partially formed integrated circuit of FIGS. 5A and 5B after depositing a layer of a spacer material, in accordance with some embodiments of the invention.

Next, with reference to FIG. 6, a layer 170 of spacer material is blanket deposited conformally over exposed surfaces, including the hard mask layer 130 and the top and sidewalls of the primary mask layer 140. The spacer material may be any material that can act as a mask for transferring a pattern to the underlying hard mask layer 130. The spacer material may be, without limitation, silicon, silicon oxide and silicon nitride. In the illustrated embodiment, the spacer material is silicon oxide, which provides particular advantages in combination with other selected materials of the masking stack.

Methods for spacer material deposition include atomic layer deposition, e.g., using a self-limiting deposition with a silicon precursor and a subsequent exposure to an oxygen or nitrogen precursor to form silicon oxides and nitrides, respectively. In some embodiments, to form silicon oxide, a silicon halide, such as silicon hexachlorodisilane (HCD), is introduced in alternating pulses with an oxygen precursor, such as $H_2O$. ALD can be performed at relatively low temperatures, e.g., under about 200° C. or under about 100° C., which has advantages for preventing thermal damage to underlying carbon-based materials, such as photoresist and amorphous carbon layers. In other embodiments, chemical vapor deposition is used to deposit the spacer material, e.g., using $O_3$ and TEOS to form silicon oxide.

The thickness of the layer 170 is determined based upon the desired width of the spacers 175 (FIG. 7A). For example, in some embodiments, the layer 170 is deposited to a thickness of about 20-80 nm or about 40-60 nm to form spacers of roughly similar widths. The step coverage is about 80% or greater and or about 90% or greater.

With reference to FIGS. 7A and 7B, the silicon oxide spacer layer 170 is subjected to an anisotropic etch to remove spacer material from horizontal surfaces 180 of the partially formed integrated circuit 100.

Figure 8A:
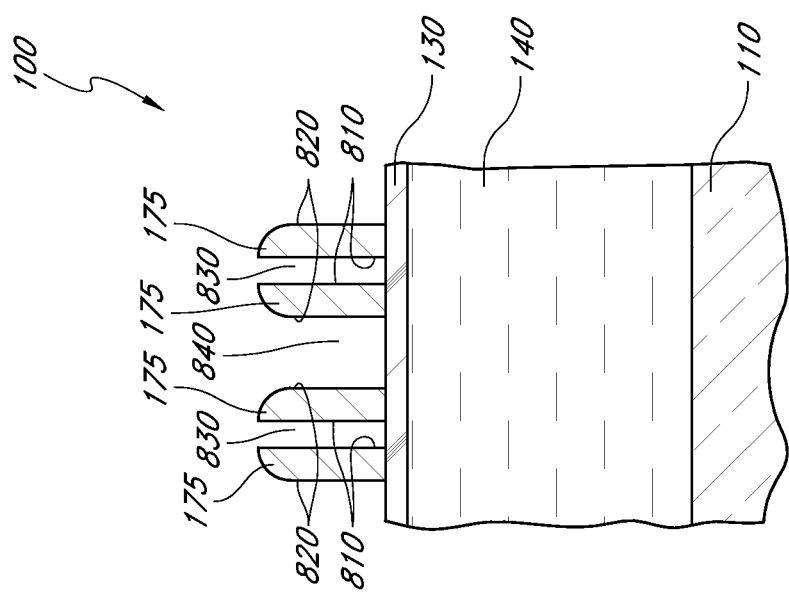
FIGS. 8A and 8B are schematic, cross-sectional side views of the partially formed integrated circuit of FIGS. 7A and 7B after removing a remaining portion of the temporary layer to leave a pattern of free-standing spacers, in accordance with some embodiments of the invention.
Figure 8B:
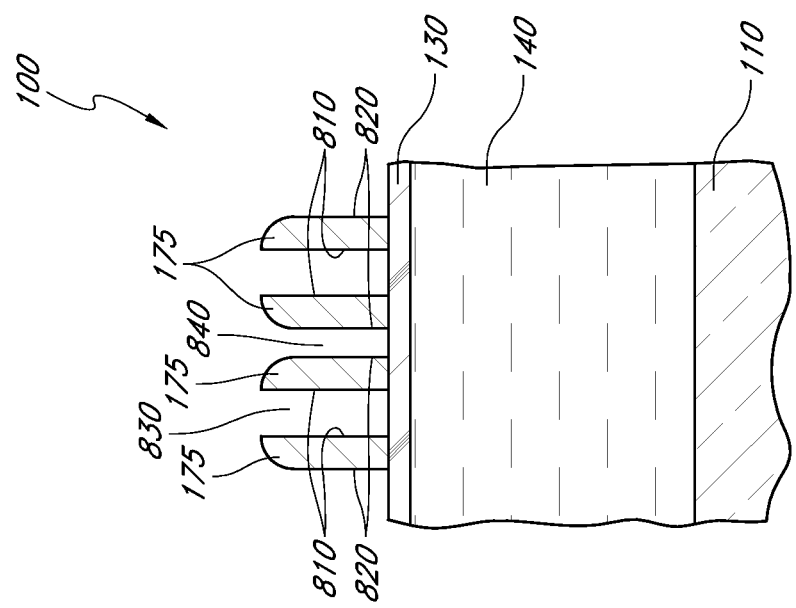

With reference to FIGS. 8A and 8B, the selectively definable layer 120 is next removed to leave freestanding spacers 175. The selectively definable layer 120 may be selectively removed using an organic strip process or various other etching processes.

Thus, pitch-multiplied mask features, the spacers 175, have been formed. In the illustrated embodiment, the spacers 175 form elongated loops and have substantially parallel legs which are joined at their ends. The pitch of the spacers 175 is roughly half that of the photoresist lines 124 and spaces 122 (FIGS. 4A and 4B) originally formed by photolithography, but the pitch can vary due to process deviations, as discussed herein. For example, where the photoresist lines 124 had a pitch of about 200 nm, spacers 175 having a pitch of about 100 nm or less may be formed. It will be appreciated that because the spacers 175 are formed on the sidewalls of the features, such as lines 124b, the spacers 175 generally follow the outline of the pattern of lines 124a in the modified photodefinable layer 120a and, so, form a closed loop in the spaces 122a between the lines 124a.

Next, in a second phase of methods according to some embodiments of the invention, augmentation material is deposited on the spacers 175 and the augmentation material is etched to achieve a desired inner and outer space balance.

With continued reference to FIGS. 8A and 8B, the freestanding spacers 175 have straight inner walls 810 and curved outer walls 820. The space between adjacent straight inner walls 810 defines the inner spaces 830. The space between adjacent outer walls 820 defines the outer space 840. Unless modified, imbalances between the widths of the inner space 830 and the outer space 840 will typically result in the formation of features having non-uniform transfer of the spacer pattern to the underlying substrate.

Process variations can cause the various imbalances between the widths of the inner space 830 and the outer space 840. In certain embodiments, as shown in FIG. 8A, the outer spaces 840 are larger in dimension than the inner spaces 830. In other embodiments, as illustrated in FIG. 8B, the inner spaces 830 are larger in dimension with respect to the outer spaces 840.

Non-uniformities between the inner spaces 830 and the outer spaces 840 can be measured by methods known in the art. For example, in the case of a partially formed integrated circuit, a metrology tool can determine the positions of the spacers 175 and the relative dimensions of the inner and outer spaces 830, 840. The imbalance with respect to the spacers 175 can then be adjusted using methods herein described.

Figure 9A:
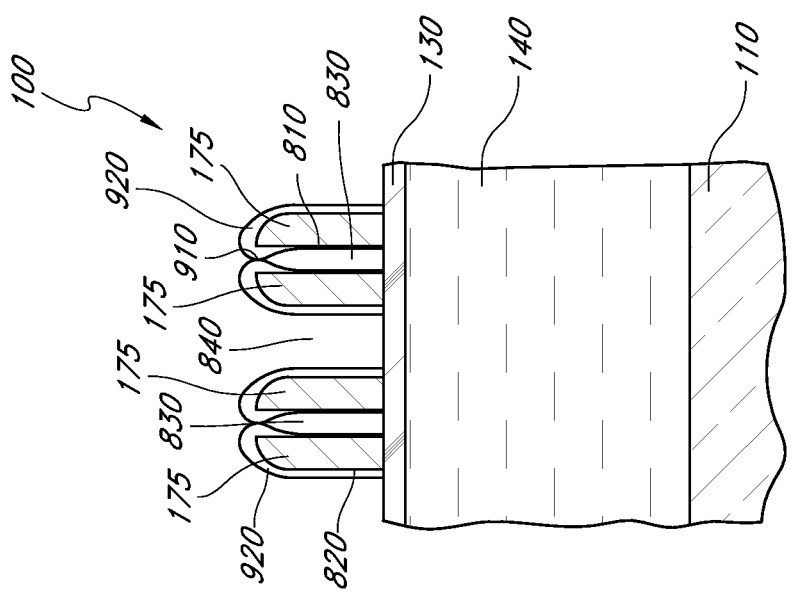
FIGS. 9A and 9B are schematic, cross-sectional side views of the partially formed integrated circuit of FIGS. 8A and 8B after depositing augmentation material between and over the spacers, in accordance with some embodiments of the invention.
Figure 9B:
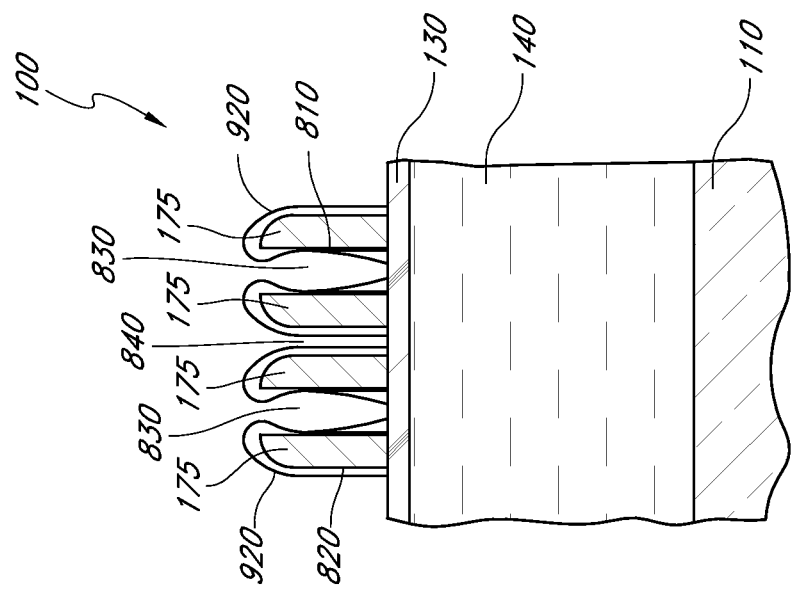

With reference to FIGS. 9A and 9B, augmentation material, e.g., polymer, is deposited, e.g., by chemical vapor deposition, between and over the spacers 175. The deposition can be achieved in an etch chamber in which process conditions are selected to cause deposition of material on the spacers 175. For example, in some embodiments, carbon-containing process gases such as $CF_4$ and $CH_2F_2$ are flowed into a reaction chamber having a RF power from about 300 W to about 1000 W and a RF bias voltage from about 150 V to about 500 V, with the ratio of $CF_4:CH_2F_2$ less than about 2.

Since the spacers 175 are formed having a straight inner wall 810, which is straight relative to the curved outer wall 820, the augmentation material is deposited more thickly over the curved outer wall 820 due to its increased surface area. As used herein, "inner wall" and "outer wall" can refer to opposite sides of the same spacer 175. While the invention is not limited by theory, it is believed that the preferential deposition on the curved outer wall, in conjunction with the abrupt drop-off of the relatively straight inner wall 810, cause the augmented material to begin bridging neighboring spacers 175 that have inner walls 810 facing each other. The inner wall 810 receives less deposited material due to its structural shape, but also because in some embodiments a bridge 910 may completely or partially form to block off any further deposition in between the inner walls 810.

Figure 10:
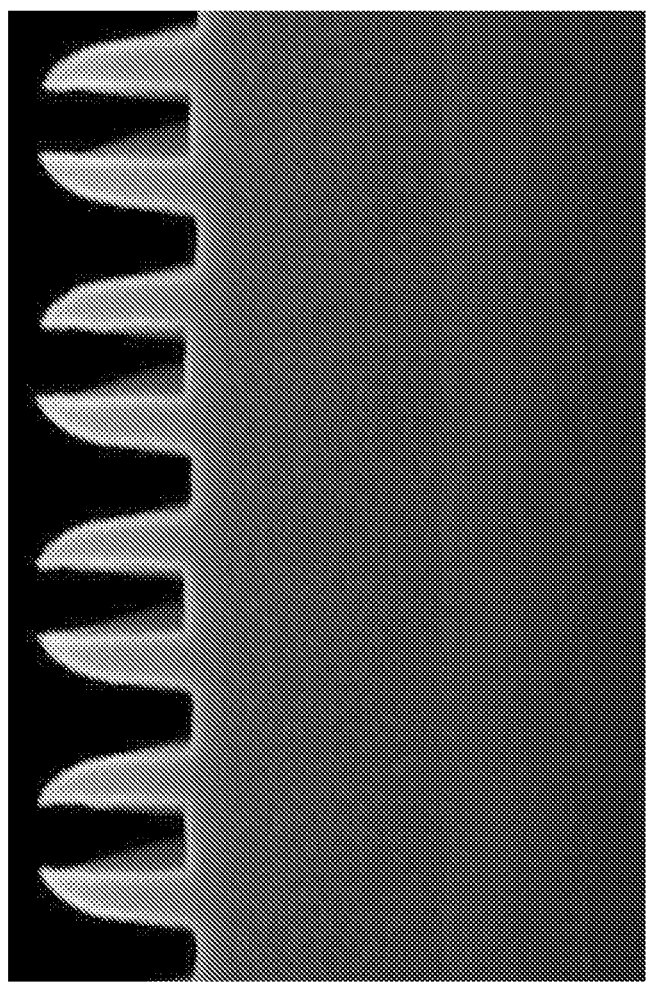
FIG. 10 is a scanning electron micrograph showing the spacers formed after a spacer etch, according to some embodiments of the invention.
Figure 11:
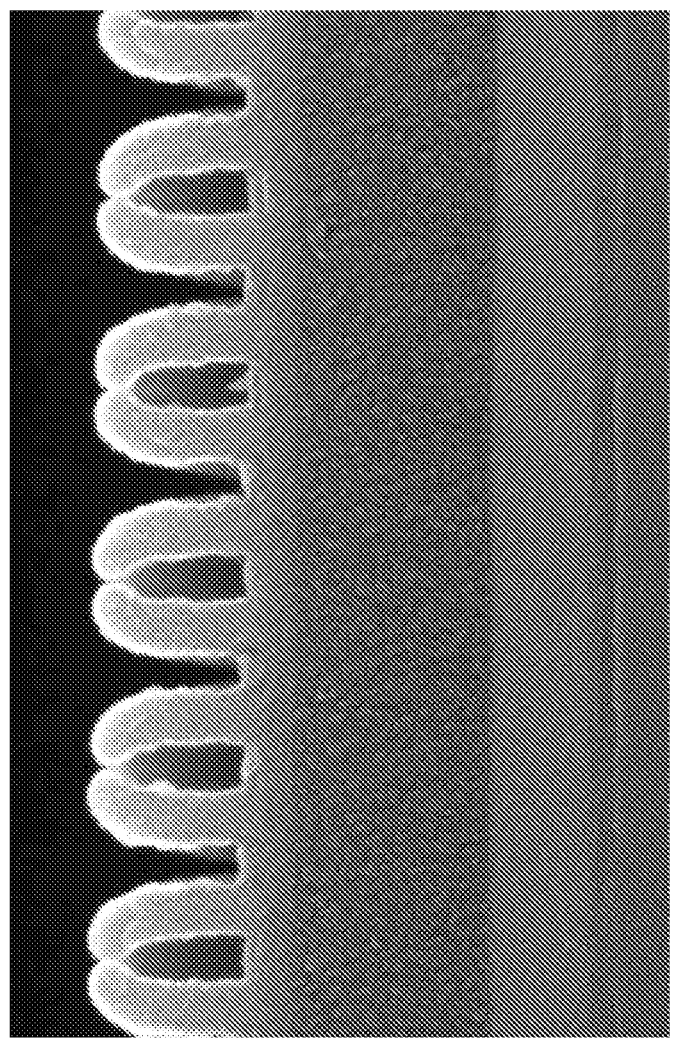
FIG. 11 is a scanning electron micrograph showing the spacers after augmentation material deposition and the formation of an augmentation material bridge between spacers, according to some embodiments of the invention.

FIG. 10 shows a scanning electron micrograph of spacers formed after a spacer etch. FIG. 11 shows the spacers after augmentation material deposition and the formation of an augmentation material bridge between spacers.

With reference again to FIG. 9A, augmentation material 920 is deposited onto the spacers 175 of FIG. 8A, in which the outer spaces 840 are enlarged with respect to the inner spaces 830. The augmentation material 920 deposition occurs preferentially on the curved outer wall 820. In certain embodiments, however, as the deposition progresses, the deposited material begins to bridge the inner space 830. The inner space 830 can become blocked by a bridge 910 forming between adjacent straight inner walls 810. This prevents the addition of further augmentation material 920, resulting in the growth of the outer wall 820 and reduction in the outer space 840.

FIG. 9B illustrates the deposition of augmentation material 920 onto the spacers 175 of FIG. 8B, in which the inner spaces 830 are enlarged with respect to the outer spaces 840. The augmentation material 920 deposition also occurs preferentially on the curved outer wall 820, but in certain embodiments, due to the enlarged dimension of the inner space 830 relative to the outer space 840, a greater degree of augmentation material 920 deposition occurs on the inner walls 810 of the spacers 175 than if the outer space 840 were larger than the inner space 830 (FIG. 9A).

Figure 12A:
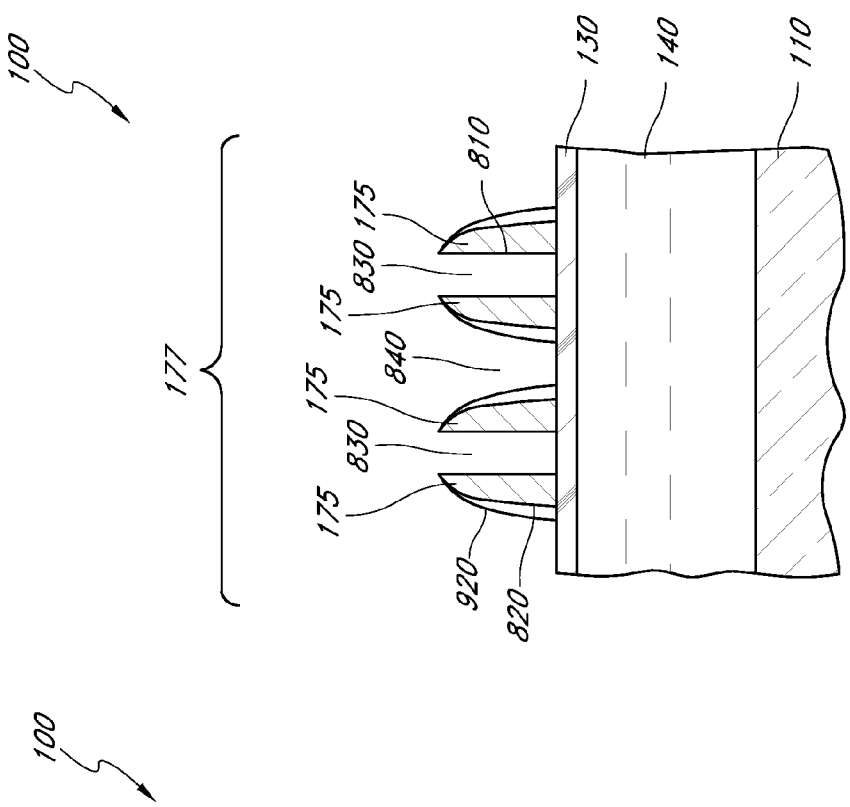
FIGS. 12A and 12B are schematic, cross-sectional side views of the partially formed integrated circuit of FIGS. 9A and 9B after etching the augmentation material, in accordance with some embodiments of the invention.

With reference to FIG. 12A, a high bias voltage anisotropic etch is applied to etch the deposited polymer material. In one or more embodiments, the etch has a low oxygen content, which has advantages for controllably combusting and removing carbon species without completely removing deposited polymer material. This etch provides a substantially vertical inner wall 810, and has a sufficiently high aggressiveness to substantially remove the deposited material on the inner wall 810, but preserve a desired amount of deposited polymer on outer wall 820 to result in a desired net decrease in the width of the outer space 840 due to increasing the width of the spacers 175 on the outer wall 820 side of the spacers 175. In certain embodiments, the anisotropic etch may include oxygen and a halide-containing etchant, the halides chosen from the group F, Cl, Br, and I. An example of a suitable etch chemistry includes HBr, $O_2$, and He. It will be appreciated that suitable etch conditions, including RF conditions, will vary depending on various factors, including the etching system, chemistries, deposited materials, and etch conditions used. In some embodiments, $N_2$ and/or Ar can be added to help stabilize the system. In some embodiments, the RF power is in the range from about 200 W to about 1000 W and the RF bias voltage is in the range from about 300 V to about 800 V.

Figure 12B:
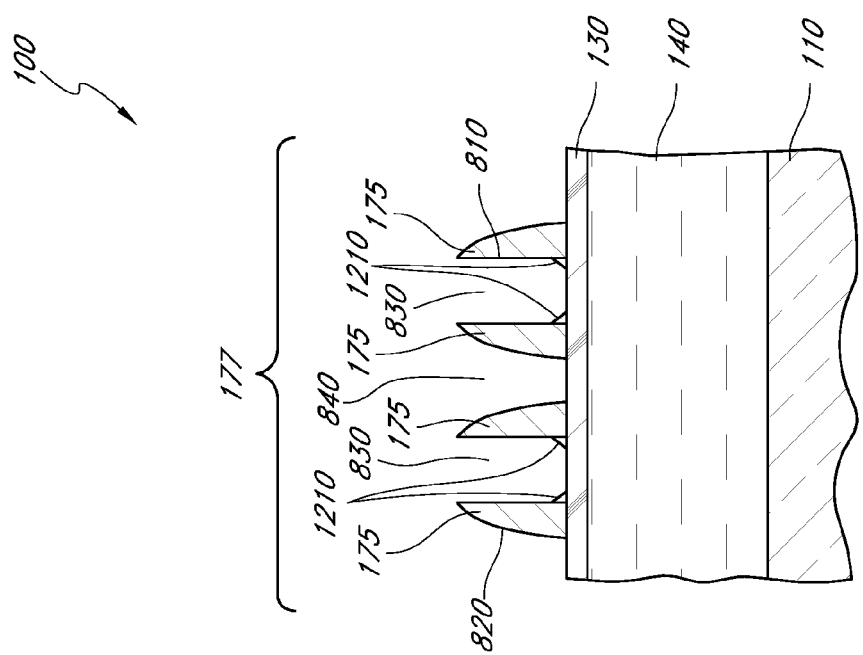

FIG. 12B illustrates a low bias voltage anisotropic etch (e.g., a plasma etch, which is often referred to as a "dry etch") performed on the structure of FIG. 8B where the inner space 830 was larger relative to the outer space 840. This etch has a sufficiently low aggressiveness to remove the augmentation material more gradually in the corners of the inner space 830 and more aggressively at the midpoints of the inner space or the outer spacer, such that footers 1210 remain on each side of the inner wall 810. These footers 1210 function to increase the base width of the inner wall 810, which decreases the effective width of the inner space 830 and narrows the exposed surface of the hard mask layer 130.

The footers 1210 limit the etch of the underlying hard mask 130, which thereby controls the transfer of the pattern from the combined augmentation material 920 and spacers 175 to the underlying hard mask layer 130. In certain embodiments, the etch may include oxygen and a halide species. A suitable etch chemistry includes $O_2$, He, and $CHF_3$. As noted above, suitable etch conditions, including bias voltages, will vary depending on the etching system, chemistries, deposited materials, and etch conditions used. In some embodiments, the RF power is in the range from about 200 W to about 1000 W and the RF bias voltage is in the range from about 0 V to about 300 V.

Advantageously, the resulting spacers 175 have a desired spacing, which can be exceptionally uniform or non-uniform to a desired degree in some embodiments. In some embodiments, the spacers 175 can be used for defining a pattern in the substrate 110, directly, without any intervening masking levels. In other embodiments, the pattern formed by the spacers 175 can be transferred to one or more masking levels before being transferred to the substrate 110.

Figure 13A:
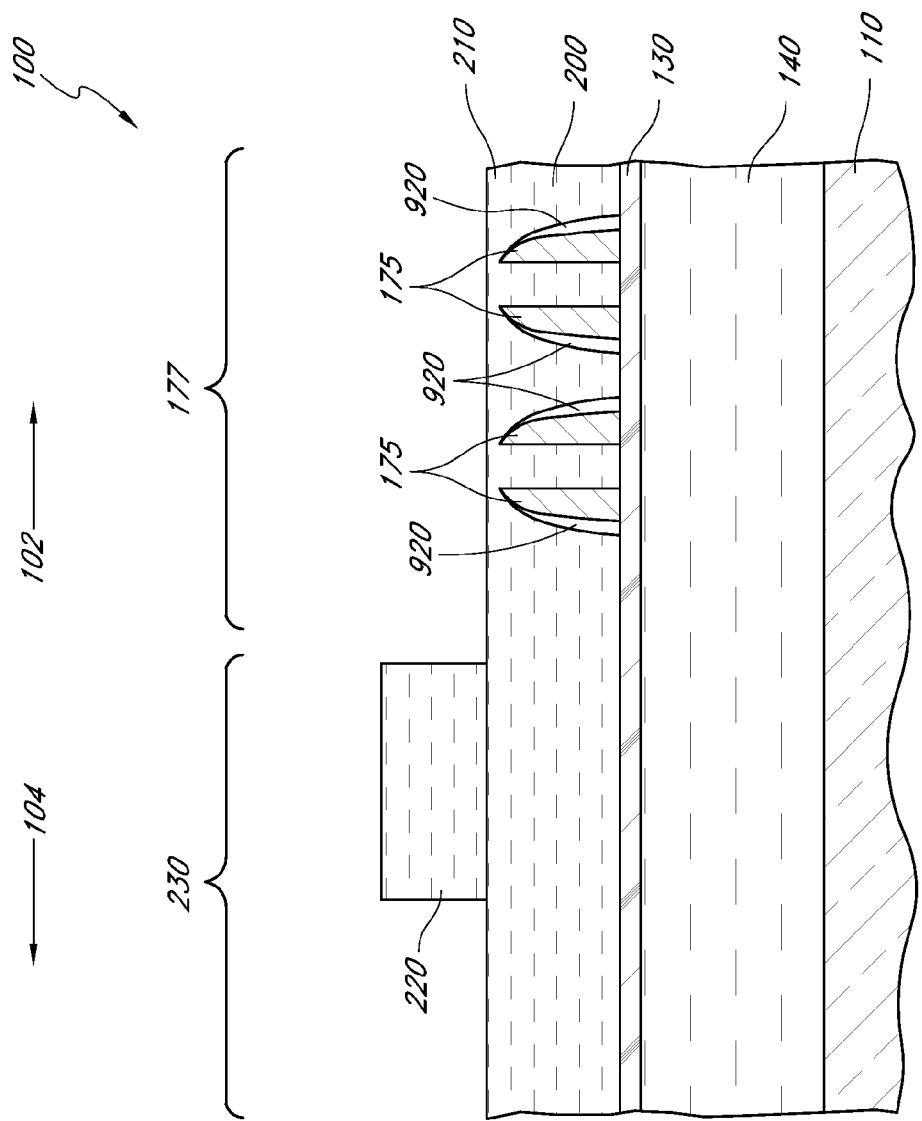
FIGS. 13A and 13B are schematic, cross-sectional side views of the partially formed integrated circuit of FIGS. 12A and 12B after forming another mask pattern overlying the substrate and before transferring the spacer pattern to the substrate, in accordance with some embodiments of the invention.
Figure 13B:
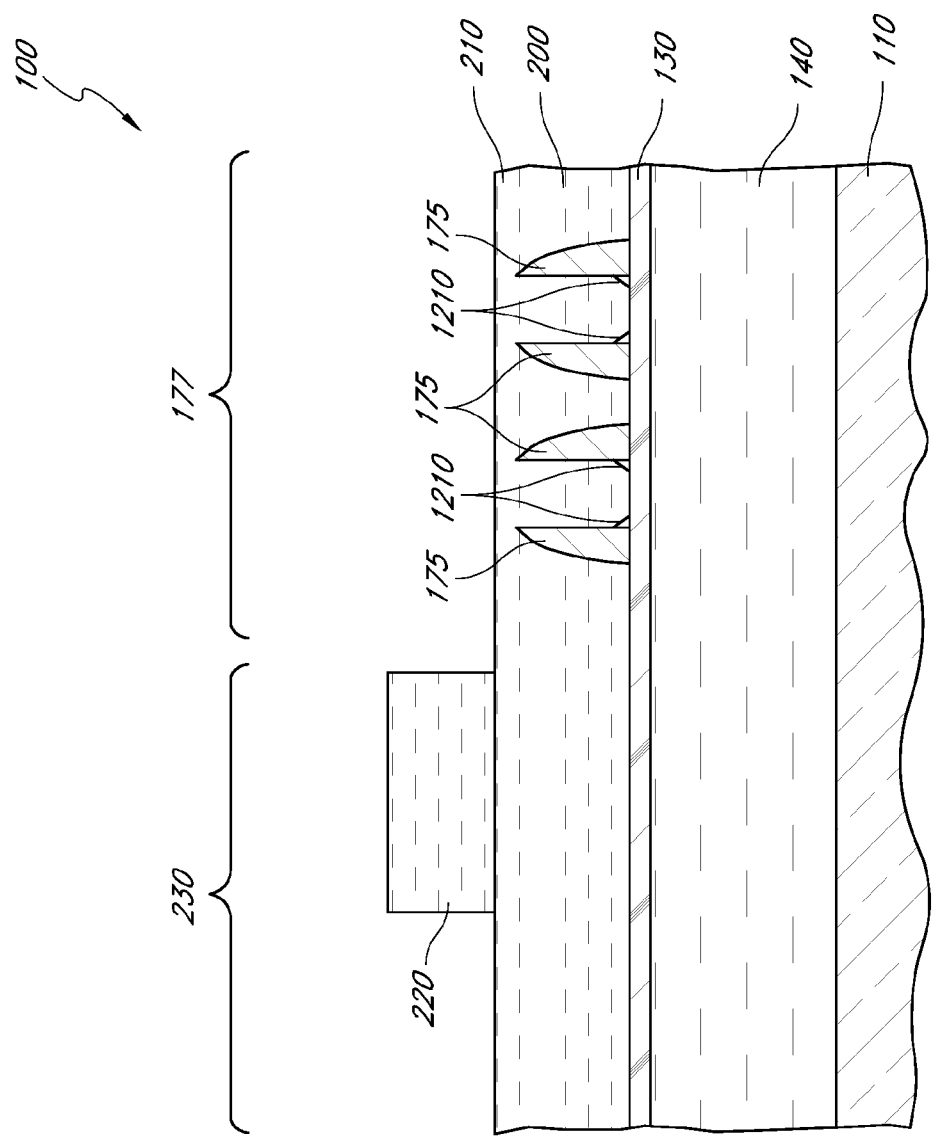
Figure 14A:
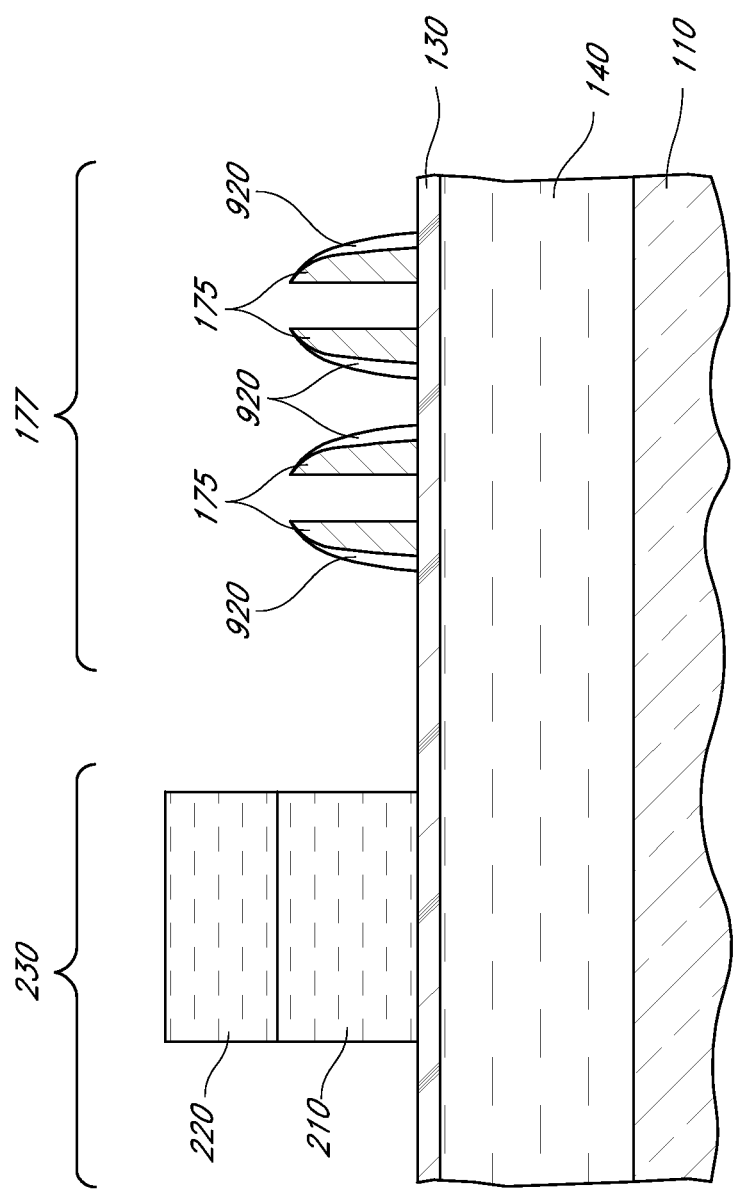
FIGS. 14A and 14B are schematic, cross-sectional side views of the partially formed integrated circuit of FIGS. 13A and 13B where the mask pattern is transferred to a planarization layer on the same level as the spacer pattern in preparation for transfer to the underlying hard mask layer, in accordance with some embodiments of the invention.
Figure 14B:
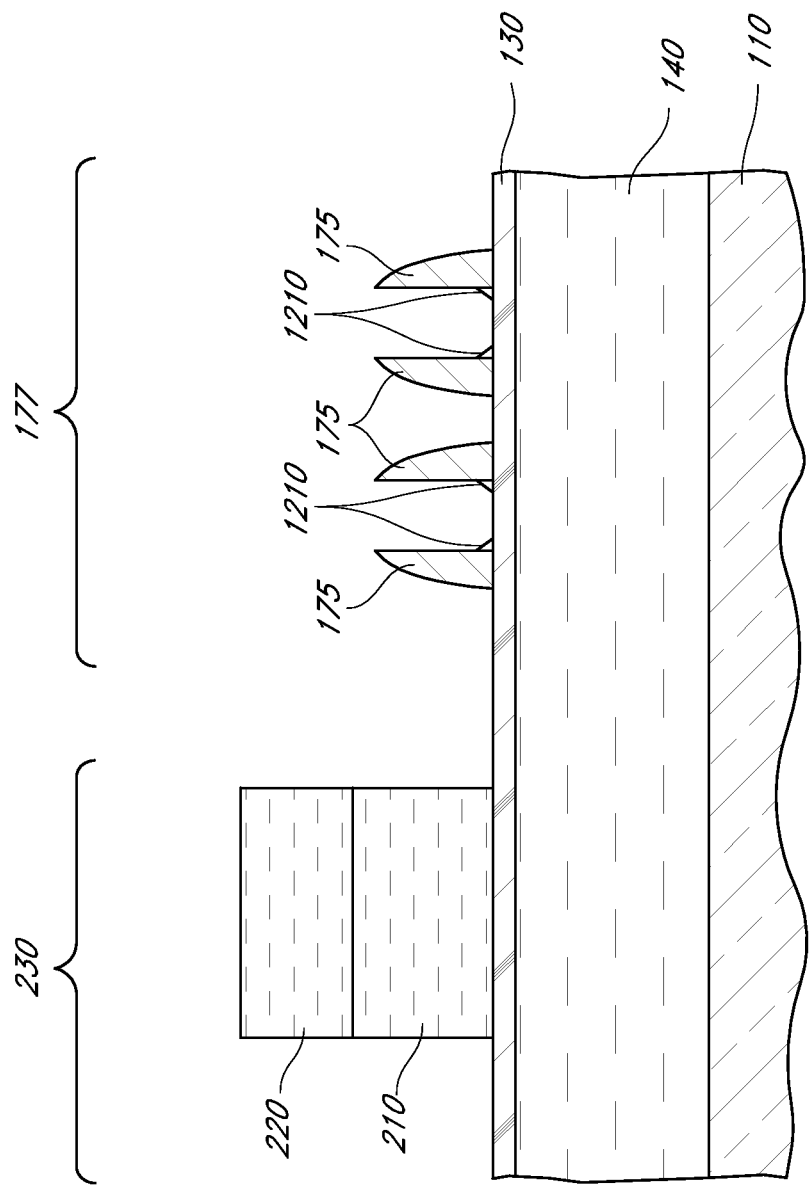

In some other embodiments as seen in FIGS. 13A and 13B, the spacers 175 are combined with another mask pattern before being transferred to the substrate 110. For example, a planarization material 210 can be deposited around the spacers 175 and the planarization material 210 can be patterned to form a combined pattern with the spacers 175. A selectively definable material 220 can be deposited over the planarization layer 210. The selectively definable material 220 can then be patterned to form a second pattern 230 in a level above the spacers. For example, the selectively definable material 220 can be patterned by photolithography to define features in a periphery of the partially formed integrated circuit 100. The second pattern is subsequently transferred to the planarization layer 210, thereby being consolidated on the same level as the spacers 175, as shown in FIGS. 14A and 14B. In other embodiments, the planarization material 210 can be a selectively definable material 220 such as photoresist, including positive or negative photoresist. The photoresist is then patterned to form the second pattern on the same level as the spacers 175. The combined pattern formed by the patterned planarization layer and the spacers 175 can then be transferred to underlying layers or directly to the substrate 110. In some other embodiments, a pattern is formed by etching an underlying hard mask layer using the spacers 175 as a mask and a planarization material is deposited about the features formed in the underlying hard mask layer, thereby allowing those features to be processed and combined with a second pattern as discussed above for the spacers 175. Suitable methods for forming the second pattern in combination with spacers can be found in. e.g., U.S. patent application Ser. No. 11/214,544, filed Aug. 29, 2005.

Figure 15B:
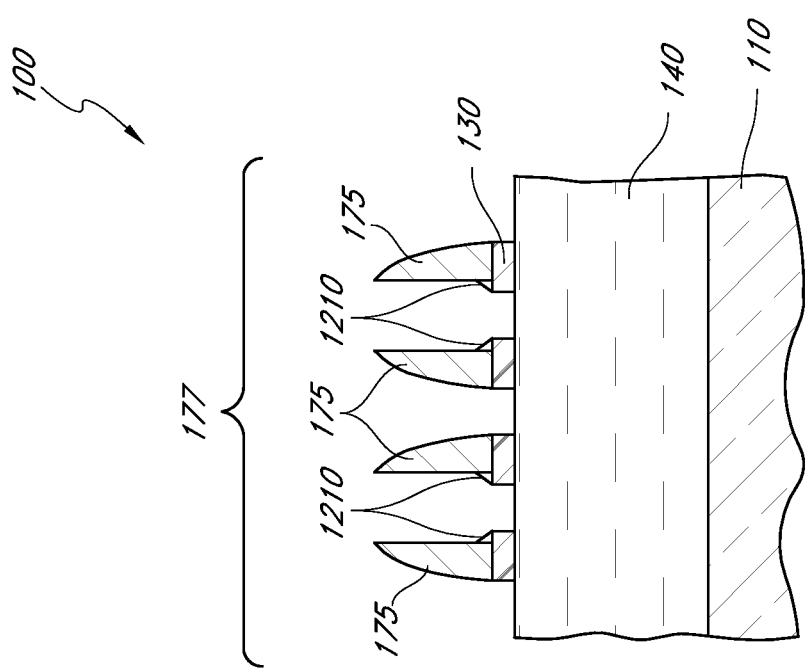

With reference to FIGS. 15A and 15B, the spacer pattern 177 is transferred to the hard mask layer 130. The pattern transfer may be accomplished by, e.g., anisotropically etching the hard mask layer 130.

Figure 16A:
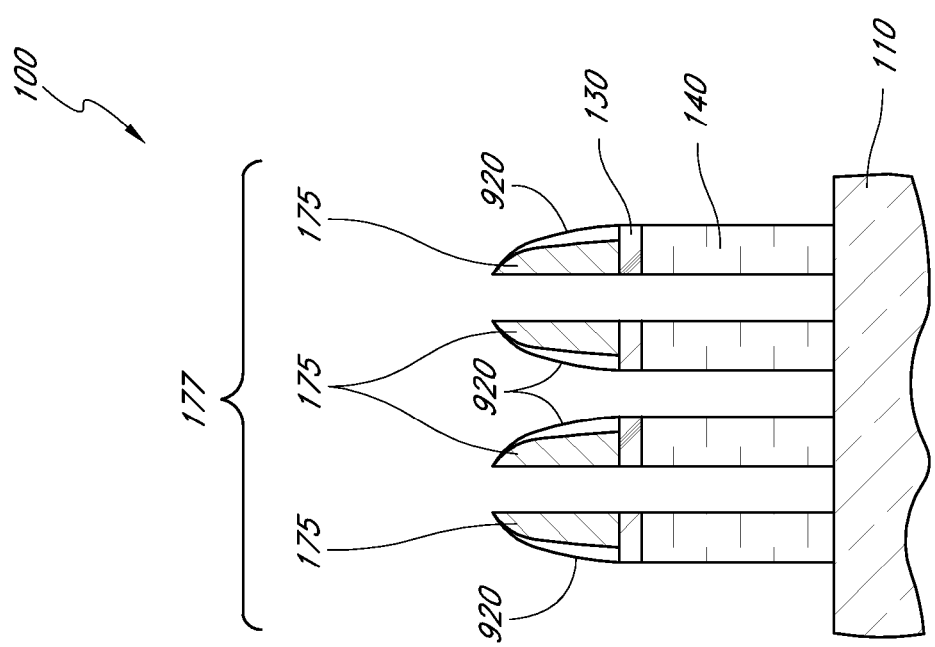
Figure 17B:
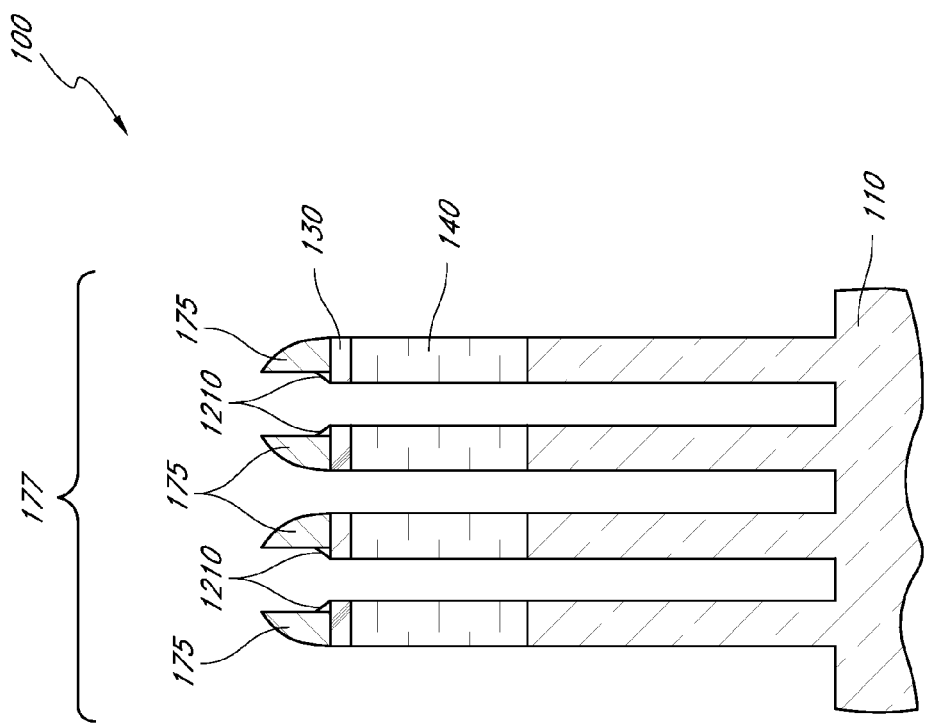

With reference to FIGS. 16A and 16B, the pattern 177 is transferred to the primary mask layer 140. The pattern transfer may be accomplished by, e.g., anisotropically etching the primary mask layer 140. With reference to FIGS. 17A and 17B, the pattern 177 is transferred to the substrate 110 using an anisotropic etch with the layer 140 acting as a mask for the etch.

Figure 18A:
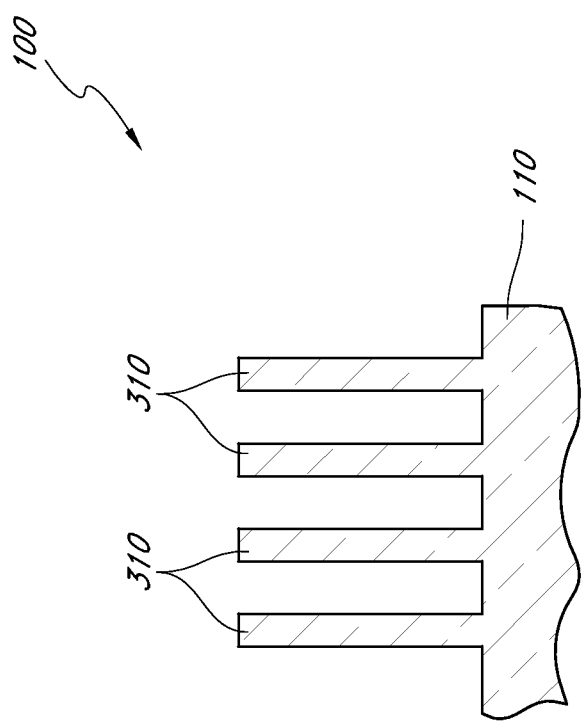
FIGS. 18A and 18B are schematic, cross-sectional side and top views of the partially formed integrated circuit of FIGS. 17A and 17B after transferring the pattern into the substrate and removing hard mask layers overlying the substrate, in accordance with some embodiments of the invention.
Figure 18B:
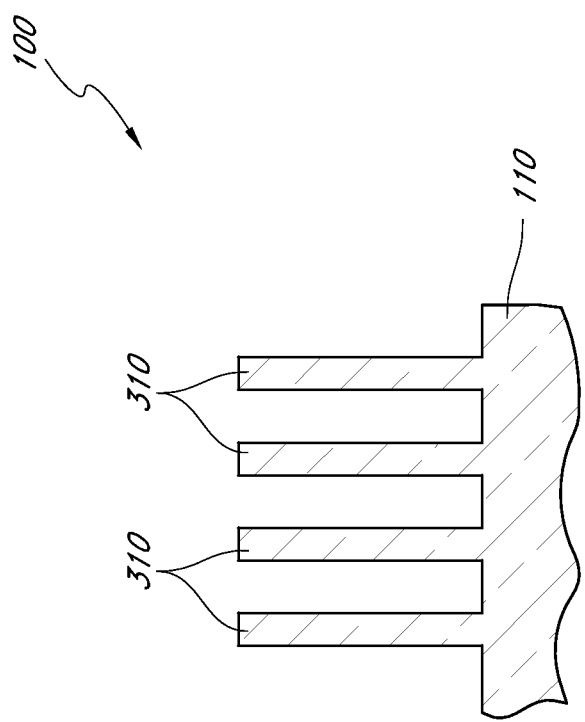
Figure 19:
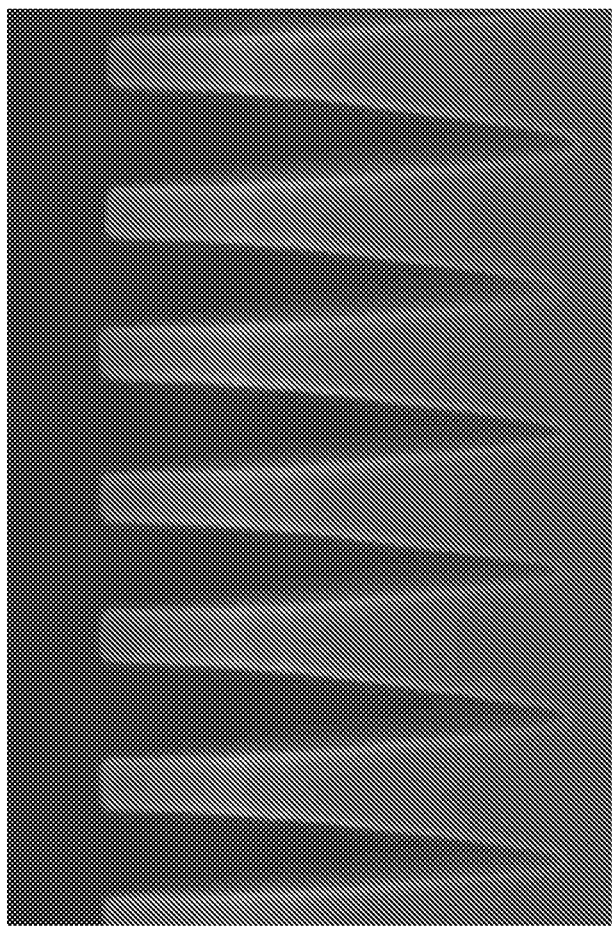
FIG. 19 is a scanning electron micrograph showing features formed in a substrate, in accordance with some embodiments of the invention.

With reference to FIGS. 18A and 18B, the spacers 175 and mask layers 130 and 140 overlying the substrate 110 are removed. Pitch multiplied lines 310 are formed in the substrate 110. As seen in FIGS. 15A-18B, the inner and outer space balancing of the spacers transfers to the hard mask layer 130, the primary mask layer 140, and the substrate 110, such that the inner 830 and outer spaces 840 are substantially equalized. Advantageously, the resulting features have exceptionally uniform spacing as shown in the SEM of FIG. 19.

Example 1

Silicon oxide spacers were augmented by deposition of a polymer in a reaction chamber of a 2300 Versys Kiyo from Lam Research Corporation of Fremont, Calif., United States. $CF_4$ and $CH_2F_2$ were flowed into the reaction chamber. The $CF_4$ was flowed at about 40 sccm and the $CH_2F_2$ was flowed at about 80 sccm. The substrate temperature was about 50° C. and the reaction chamber pressure was about 40 mTorr. The TCP power was about 500 W, the RF bias power was about 50 W and the RF bias voltage was about 265V.

The polymer deposition resulted in polymer bridging. The deposited polymer was etched to open the inner space. The etch chemistry included HBr, $O_2$, and He. The HBr was provided to the reaction chamber at a flow rate of about 90 sccm, the $O_2$ was flowed at about 60 sccm, and the He was flowed at about 120 sccm. The substrate temperature was about 50° C. and the reaction chamber pressure was about 5 mTorr. The TCP power was about 300 W, the RF bias power was about 0 W and the RF bias voltage was about 600V. Advantageously, the resulting spacers had a desirably narrowed outer space.

Example 2

Silicon oxide spacers were augmented by deposition and etching of a polymer in a reaction chamber of a 2300 Versys Kiyo from Lam Research Corporation of Fremont, Calif., United States. $CF_4$ and $CH_2F_2$ were flowed into the reaction chamber. The $CF_4$ was flowed at about 40 sccm and the $CH_2F_2$ was flowed at about 80 sccm. The substrate temperature was about 50° C. and the reaction chamber pressure was about 40 mTorr. The TCP power was about 500 W, the RF bias power was about 50 W, and the RF bias voltage was about 265V.

The polymer deposition resulted polymer bridging. The deposited polymer was etched to open the inner space. The etch chemistry included $O_2$, He, and $CHF_3$, provided to the reaction chamber. The $O_2$ was provided to the reaction chamber at a flow rate of about 60 sccm, the He was flowed at about 120 sccm, and the $CHF_3$ was flowed at about 90 sccm. The substrate temperature was about 50° C. and the reaction chamber pressure was about 15 mTorr. The TCP power was about 600 W, the RF bias power was about 0 W, and the RF bias voltage was about 150V. Advantageously, the resulting spacers had a desirably narrowed inner space.

It will be appreciated from the description herein that the invention includes various embodiments. For example, certain embodiments of the present invention provide a method for integrated circuit processing including providing a plurality of spacers overlying a material, depositing an augmentation material onto the plurality of spacers, the augmentation material bridging upper portions of pairs of neighboring spacers without bridging together upper portions of neighboring pairs of spacers, etching the augmentation material to form a pattern of augmented spacers, and transferring the pattern to the underlying material.

Certain other embodiments of the present invention provide a method of integrated circuit processing including selectively forming an augmentation material on an outer sidewall surface or an inner sidewall surface of a plurality of spacers, forming a pattern in an underlying material wherein features of the pattern are derived from the plurality of augmented spacers.

Certain embodiments of the present invention provide a method for patterning a substrate, including determining dimensions of an inner and outer space of a plurality of spacers, depositing a polymer onto the plurality of spacers, selecting an etch power to etch the polymer to achieve a desired open space dimension between the augmented spacers, and forming a pattern in an underlying substrate, wherein features of the pattern are derived from features of the augmented spacers.

Certain embodiments of the present invention provide a method for integrated circuit fabrication including providing a plurality of spacers, each spacer having an outer sidewall and an inner sidewall, the outer sidewall having a curved upper portion, wherein the inner sidewall is vertically straight relative to the outer sidewall. One of the inner or outer sidewalls of each spacer are substantially selectively laterally expanded.

It will also be appreciated by those skilled in the art that various omissions, additions and modifications may be made to the methods and structures described above without departing from the scope of the invention. All such modifications and changes are intended to fall within the scope of the invention, as defined by the appended claims.

What is claimed is:

1. A method for integrated circuit fabrication, comprising:

providing a plurality of spacers, each spacer having an outer sidewall and an inner sidewall, the outer sidewall having a curved upper portion, wherein the inner sidewall is vertically straight relative to the outer sidewall;

subsequently substantially selectively laterally expanding one of the inner or outer sidewalls of each spacer, wherein the other of the inner or outer sidewalls is exposed at an onset of subsequently substantially selectively laterally expanding one of the inner or outer sidewalls and wherein the other of the inner or outer sidewalls is at substantially a same position after substantially laterally expanding as before substantially expanding.

2. The method of claim 1, wherein providing the plurality of spacers includes providing a distance separating immediately adjacent inner sidewalls of the spacers that is smaller than a distance separating immediately adjacent outer sidewalls of the spacers.

3. The method of claim 2, wherein substantially selectively laterally expanding comprises depositing an augmentation material on the spacers, the augmentation material forming a bridge extending between the immediately adjacent inner sidewalls.

4. The method of claim 3, wherein substantially selectively laterally expanding further comprises selectively etching the augmentation material from one of the inner or outer sidewalls.

5. The method of claim 1, wherein providing the plurality of spacers includes providing a distance separating immediately adjacent inner sidewalls of the spacers that is larger than a distance separating immediately adjacent outer sidewalls of the spacers.

6. The method of claim 5, wherein substantially selectively laterally expanding comprises depositing an augmentation material on the spacers, the augmentation material preferentially depositing on the outer sidewalls.

7. The method of claim 6, wherein substantially selectively laterally expanding further comprises selectively etching the augmentation material from one of the inner or outer sidewalls.

8. The method of claim 1, further comprising transferring a pattern to the substrate by processing the substrate through open spaces between the inner and outer sidewalls of adjoining spacers.

9. A method for integrated circuit fabrication, comprising:

providing a plurality of spacers, each spacer having an outer curved sidewall and a substantially straight inner sidewall;

selectively providing an augmentation material on one of the outer sidewalls or the inner sidewalls, wherein the other of the outer sidewall or the inner sidewall is substantially devoid of augmentation material and is exposed at an onset of selectively providing an augmentation material;

forming a pattern in an underlying material, wherein features of the pattern are derived from the plurality of augmented spacers.

10. The method of claim 9, wherein the plurality of spacers are formed by a process, comprising:
   providing a plurality of spaced-apart mandrels;
   blanket depositing a layer of spacer material on the spaced-apart mandrels;
   selectively etching the layer of spacer material; and
   selectively removing the mandrels relative to the spacers.

11. The method of claim 10, wherein the mandrels are formed of photoresist.

12. The method of claim 9, wherein forming a pattern in the underlying material comprises selectively etching a substrate relative to the augmentation material layer.

13. The method of claim 9, wherein selectively providing the augmentation material comprises depositing augmentation material on the spacers and selectively removing the augmentation material from the inner or the outer sidewalls.

14. The method of claim 13, wherein the augmentation material is a polymer.

15. The method of claim 13, wherein selectively providing the augmentation material comprises chemical vapor depositing a polymer using a halogen-containing carbon precursor.

16. The method of claim 9, wherein the underlying material is a substrate, further comprising a hard mask layer between the spacers and the substrate.

17. A method for integrated circuit fabrication, comprising:
   determining dimensions of an inner and outer space of a plurality of spacers;
   depositing a polymer onto the plurality of spacers, wherein both sides of each of the spacers are exposed at an onset of depositing a polymer;
   determining whether the inner or outer space is larger than a desired open space dimension between the augmented spacers;
   selecting an etch power to etch the polymer to achieve the desired open space dimension between the augmented spacers; and
   forming a pattern in an underlying substrate, wherein features of the pattern are derived from features of the augmented spacers,
   wherein selecting the etch power comprises providing the etch power at a level to form footers while substantially completely removing polymer from the outer space.

18. The method of claim 17, wherein determining dimensions of an inner and outer space of a plurality of spacers comprises forming spacers, wherein forming spacers comprises:
   providing a plurality of mandrels;
   depositing a spacer material on the mandrels;
   anisotropically etching the spacer material to define spacers on sidewalls of the mandrels; and
   removing the mandrels to leave free-standing spacers, the spacers each having facing curved sidewalls defining the outer space between neighboring spacers, the spacers also each having a substantially straight sidewall defining the inner spacer between neighboring spacers.

19. A method for integrated circuit fabrication, comprising:
   determining dimensions of an inner and outer space of a plurality of spacers;
   depositing a polymer onto the plurality of spacers, wherein both sides of each of the spacers are exposed at an onset of depositing a polymer;
   determining whether the inner or outer space is larger than a desired open space dimension between the augmented spacers;
   selecting an etch power to etch the polymer to achieve the desired open space dimension between the augmented spacers; and
   forming a pattern in an underlying substrate, wherein features of the pattern are derived from features of the augmented spacers,
   wherein selecting the etch power comprises providing the etch power at a level to substantially completely remove deposited polymer in the inner space, while retaining at least some polymer in the outer space.

* * * * *